United States Patent
Liu et al.

(10) Patent No.: US 11,854,770 B2
(45) Date of Patent: Dec. 26, 2023

(54) PLASMA PROCESSING WITH INDEPENDENT TEMPERATURE CONTROL

(71) Applicant: Applied Materials, Inc., Santa Clara, CA (US)

(72) Inventors: Wei Liu, San Jose, CA (US); Vladimir Nagorny, Tracy, CA (US); Rene George, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/149,232

(22) Filed: Jan. 14, 2021

(65) Prior Publication Data
US 2022/0223381 A1    Jul. 14, 2022

(51) Int. Cl.
| | |
|---|---|
| *H01L 21/3105* | (2006.01) |
| *H01J 37/32* | (2006.01) |
| *H01L 21/02* | (2006.01) |

(52) U.S. Cl.
CPC ...... *H01J 37/32449* (2013.01); *H01J 37/321* (2013.01); *H01J 37/32357* (2013.01); *H01J 37/32724* (2013.01); *H01L 21/0228* (2013.01); *H01L 21/02164* (2013.01); *H01J 2237/334* (2013.01)

(58) Field of Classification Search
CPC .................. H01L 21/3105; H01L 21/0234
See application file for complete search history.

(56) References Cited

U.S. PATENT DOCUMENTS

| | | |
|---|---|---|
| 6,770,165 B2 | 8/2004 | Obuchi |
| 8,916,022 B1 | 12/2014 | Caron |

(Continued)

FOREIGN PATENT DOCUMENTS

| | | |
|---|---|---|
| JP | 2019-176184 A | 10/2019 |
| KR | 20140128479 A | 11/2014 |
| WO | 2015145663 A1 | 10/2015 |

OTHER PUBLICATIONS

PCT/US2021/063652, International Search Report and Written Opinion dated Apr. 12, 2022, 12 pages.

(Continued)

*Primary Examiner* — Thomas T Pham
(74) *Attorney, Agent, or Firm* — PATTERSON & SHERIDAN, LLP

(57) ABSTRACT

Embodiments of the present disclosure generally relate to inductively coupled plasma sources, plasma processing apparatus, and independent temperature control of plasma processing. In at least one embodiment, a method includes introducing a process gas into a gas injection channel and generating an inductively coupled plasma within the gas injection channel. The plasma includes at least one radical species selected from oxygen, nitrogen, hydrogen, NH and helium. The method includes delivering the plasma from the plasma source to a process chamber coupled therewith by flowing the plasma through a separation grid between the plasma source and a substrate. The method includes processing the substrate. Processing the substrate includes contacting the plasma including the at least one radical species with a first side of the substrate facing the separation grid and heating the substrate using a plurality of lamps located on a second side of the substrate opposite the separation grid.

23 Claims, 7 Drawing Sheets

(56) References Cited

U.S. PATENT DOCUMENTS

| | | |
|---|---|---|
| 9,214,319 B2 | 12/2015 | Nagorny et al. |
| 11,658,006 B2 | 5/2023 | Nagorny et al. |
| 2004/0031564 A1 | 2/2004 | Gottscho et al. |
| 2005/0112901 A1* | 5/2005 | Ji .............................. C23G 5/00 |
| | | 438/710 |
| 2006/0019039 A1 | 1/2006 | Hanawa et al. |
| 2006/0172474 A1* | 8/2006 | Wajda ................ H01L 21/28079 |
| | | 438/151 |
| 2007/0194245 A1 | 8/2007 | Yevtukhov et al. |
| 2010/0075496 A1* | 3/2010 | Chen ................. H01L 21/02068 |
| | | 438/653 |
| 2010/0151694 A1* | 6/2010 | Peuse ................ H01L 21/67115 |
| | | 438/770 |
| 2011/0014397 A1 | 1/2011 | Yang |
| 2013/0284370 A1 | 10/2013 | Collins et al. |
| 2014/0197136 A1 | 7/2014 | Nagorny et al. |
| 2017/0170018 A1* | 6/2017 | Kim ..................... H01L 21/2254 |
| 2017/0263420 A1 | 9/2017 | Suguro |
| 2018/0166296 A1* | 6/2018 | Ma ..................... H01L 21/31058 |
| 2018/0358204 A1 | 12/2018 | Ma et al. |
| 2018/0358206 A1 | 12/2018 | Ma et al. |
| 2019/0131112 A1 | 5/2019 | Ma et al. |
| 2019/0198301 A1 | 6/2019 | Ma et al. |
| 2020/0118795 A1* | 4/2020 | Selep ................... H01J 37/3244 |
| 2020/0135485 A1* | 4/2020 | Uvais ................. H01L 21/3065 |
| 2020/0203175 A1 | 6/2020 | Ma |
| 2020/0357611 A1 | 11/2020 | Bhosle et al. |
| 2021/0050213 A1 | 2/2021 | Savas et al. |
| 2021/0074630 A1* | 3/2021 | Eissa ................. H01L 21/76816 |

OTHER PUBLICATIONS

U.S. Appl. No. 18/199,780, filed May 19, 2023, 49 pages.
PCT/US2021/065598, International Search Report/Written Opinion dated Apr. 20, 2022, 9 pages.

* cited by examiner

PLASMA PROCESSING WITH INDEPENDENT TEMPERATURE CONTROL

BACKGROUND

Field

Embodiments of the present disclosure generally relate to inductively coupled plasma sources, plasma processing apparatus, and methods of using the same, as well as independent temperature control of plasma processing.

Description of the Related Art

Plasma processing is used in the semiconductor industry for deposition, etching, resist removal, and related processing of semiconductor substrates and other substrates. Plasma sources are often used for plasma processing to produce high density plasma and reactive species for processing substrates.

Formation of plasma breaks molecules into radicals (and/or generates ions) which can be used to achieve substrate treatment in a chamber. Typically, a mixture of gases is fed into a plasma generation region (active zone) of an inductively coupled plasma (ICP) source, and electrons accelerated in the high electric field region ionize and dissociate this mixture, creating a new gas (plasma) having radicals and ions.

Conventional ICP sources for high plasma generation efficiency and wide operational range have a relatively small active zone adjacent to an ICP coil. Such active zones are designed to provide electron confinement in this zone around the coil and thus the plasma formation is primarily confined in that zone. However, as the plasma is directed toward the substrate, some chemical reactions occur between the species, reducing the number of radicals, but creating a number of new species as a result.

Therefore, there is a need for improved inductively coupled plasma sources and plasma processing apparatus, and methods of using the same. Furthermore, there is a need for precise and independent temperature control of plasma processing.

SUMMARY

Embodiments of the present disclosure generally relate to plasma processing methods.

In at least one embodiment, a plasma processing method includes introducing a process gas into a gas injection channel and generating an inductively coupled plasma within the gas injection channel. The plasma includes at least one radical species selected from oxygen, nitrogen, hydrogen, NH and helium. The method includes delivering the plasma from the plasma source to a process chamber coupled therewith by flowing the plasma through a separation grid between the plasma source and a substrate. The method includes processing the substrate. Processing the substrate includes contacting the plasma including the at least one radical species with a first side of the substrate facing the separation grid and heating the substrate using a plurality of lamps located on a second side of the substrate opposite the separation grid.

In another embodiment, a plasma processing method includes introducing a process gas into a gas injection channel defined between a gas injection insert and a sidewall of a plasma source and generating a plasma within the gas injection channel with an induction coil positioned proximate the sidewall and horizontally overlapping the gas injection channel. The plasma includes at least one of nitrogen or NH radicals. The method includes delivering the plasma from the plasma source to a process chamber coupled therewith. The plasma flows through a separation grid disposed between the plasma source and a substrate to be processed. Processing the substrate within the process chamber includes contacting the plasma with a first side of the substrate facing the separation grid and heating the substrate using a plurality of lamps located on a second side of the substrate opposite the separation grid.

In yet another embodiment, a plasma processing method includes introducing a process gas into a gas injection channel defined between a gas injection insert and a sidewall of a plasma source and generating a hydrogen plasma within the gas injection channel with an induction coil positioned proximate the sidewall and horizontally overlapping the gas injection channel. The hydrogen plasma includes hydrogen radicals. The method includes delivering the hydrogen plasma from the plasma source to a process chamber coupled therewith. The hydrogen plasma flows through a separation grid disposed between the plasma source and a substrate to be processed. Processing the substrate within the process chamber includes contacting the hydrogen plasma including the hydrogen radicals with a first side of the substrate facing the separation grid and heating the substrate using a plurality of lamps located on a second side of the substrate opposite the separation grid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to high efficiency inductively coupled plasma sources and plasma processing apparatus, and methods of using the same. Sources and apparatus of the present disclosure can provide improved plasma uniformity for processing substrates in addition to efficient delivery of high density neutral plasma species (e.g., unconventional species) to the substrates. It is conventionally assumed that more efficient generation of species in the active zones of a plasma source automatically results in more of those species near the substrate, but the inventors have noticed that this is an untrue (at least incomplete) assumption.

Aspects of the present disclosure are discussed with reference to a "substrate" or semiconductor wafer for purposes of illustration and discussion. Those of ordinary skill in the art, using the disclosures provided herein, will understand that the example aspects of the present disclosure can be used in association with any suitable semiconductor substrate or other suitable substrate. A "substrate support" refers to any structure that can be used to support a substrate.

Figure 1:
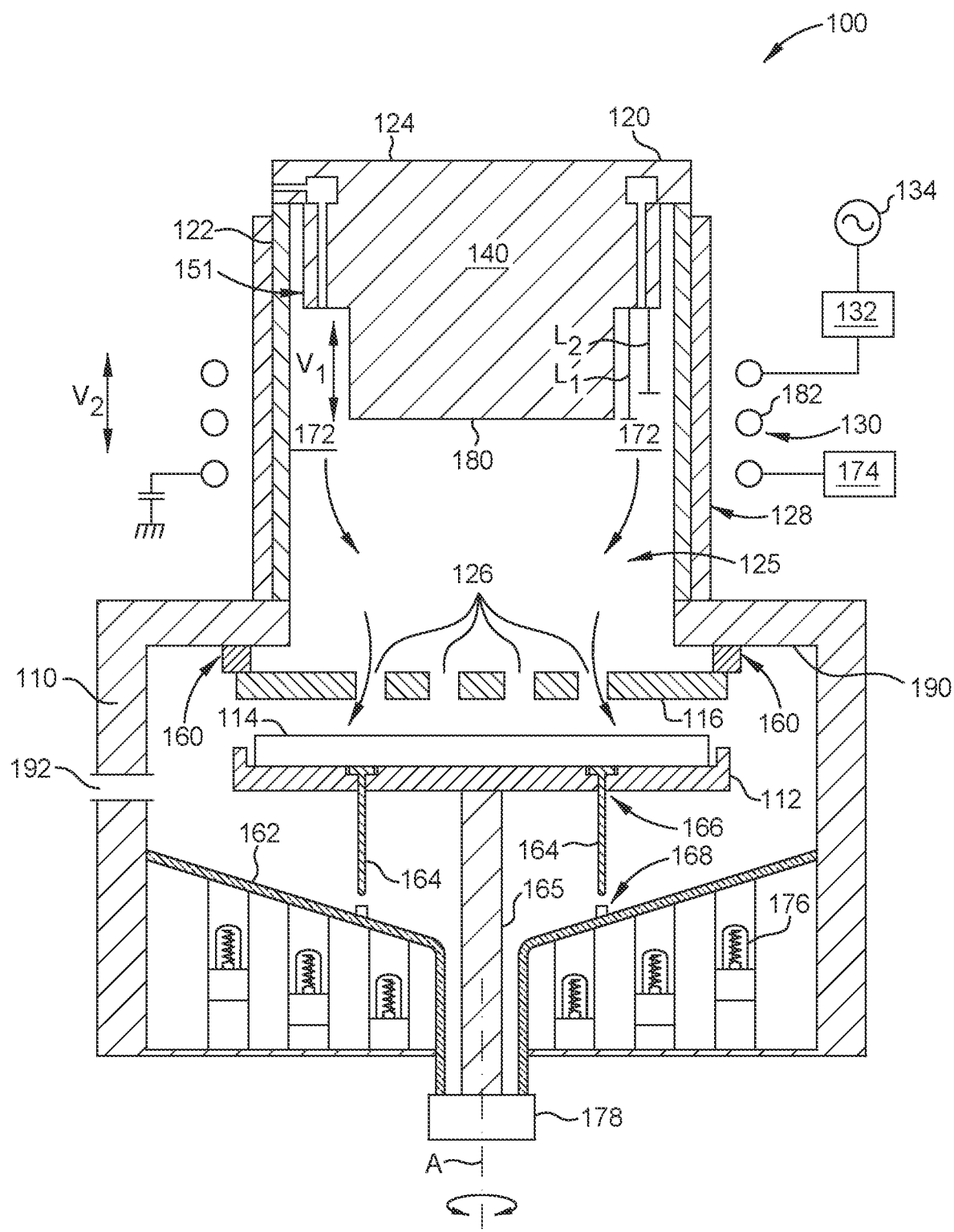
FIG. 1 is a schematic diagram of a plasma processing apparatus, according to at least one embodiment.

With reference now to the FIGS., example embodiments of the present disclosure will now be set forth. FIG. 1 depicts an example plasma processing apparatus 100. The plasma processing apparatus 100 includes a processing chamber 110 and a plasma source 120 (e.g., a remote plasma source) coupled with the processing chamber 110. The processing chamber 110 includes a substrate support 112 operable to hold a substrate 114. In some embodiments, the substrate has a thickness that is less than 1 mm. Substrate support 112 can be proximate one or more heat sources (e.g., a plurality of lamps 176) that provide heat to a substrate during processing of the substrate in the process chamber 110. Heat can be provided using any suitable heat source, such as one or more lamps, such as one or more rapid thermal processing lamps, or via a heated pedestal (e.g., a pedestal having resistive heating elements embedded therein or coupled thereto). In operation, the heat sources enable independent temperature control of the substrate which is described in more detail below.

As shown in FIG. 1, processing chamber 110 includes window 162, such as a dome, and the plurality of lamps 176. The plurality of lamps 176 are disposed between the window 162 and a bottom wall of the chamber 110. The plurality of lamps 176 are positioned in an array. The plurality of lamps 176 can be arranged in a plurality of concentric rings surrounding a center of the processing chamber 110. The plurality of lamps 176 can include 100 or more lamps, such as 200 or more lamps, such as from 200 lamps to 500 lamps, such as from 200 lamps to 300 lamps, such as 240 lamps, such as from 300 lamps to 400 lamps, such from 400 lamps to 500 lamps, such as 400 lamps. The power of each of the plurality of lamps 176 is from 400 W to 1000 W, such as from 500 W to 800 W, such as from 500 W to 600 W, such as from 600 W to 700 W, such as 645 W, such as from 700 W to 800 W. A distance from the plurality of lamps 176 to the substrate is about 50 mm or less, such as from about 5 mm to about 50 mm, such as from about 5 mm to about 20 mm, such as about 12.5 mm, such as from about 20 mm to about 50 mm, such as about 36.5 mm.

A controller (not shown) is coupled to the chamber 110, and may be used to control chamber processes described herein including controlling the plurality of lamps 176. The substrate support 112 is disposed between a separation grid 116 and the window 162. A plurality of sensors (not shown) can be disposed proximate one or more of the lamps 176 and/or the substrate support 112 for measuring the temperature within the chamber 110. The plurality of sensors can include one or more infrared pyrometers or miniature pyrometers. In certain embodiments, the one or more pyrometers includes 2, 3, or 4 pyrometers. In certain embodiments, the pyrometers have a wavelength of 3.3 μm, although in general, commercial pyrometer wavelengths typically vary from about 0.5 μm to about 14 μm. In some embodiments, the pyrometers are bottom pyrometers, meaning the pyrometers are positioned below the substrate such as proximate the plurality of lamps 176.

The substrate support 112 is coupled with a shaft 165. The shaft is connected to an actuator 178 that provides rotational movement of the shaft and substrate support (about an axis A). Actuator 178 may additionally or alternatively provide height adjustment of the shaft 165 during processing.

The substrate support 112 includes lift pin holes 166 disposed therein. The lift pin holes 166 are sized to accommodate a lift pin 164 for lifting of the substrate 114 from the substrate support 112 either before or after a deposition process is performed. The lift pins 164 may rest on lift pin stops 168 when the substrate 114 is lowered from a processing position to a transfer position.

A plasma can be generated in plasma source 120 (e.g., in a plasma generation region) by induction coil 130 and desired particles flow from the plasma source 120 to the surface of substrate 114 through holes 126 provided in a separation grid 116 that separates the plasma source 120 from the processing chamber 110 (a downstream region).

The plasma source 120 includes a dielectric sidewall 122. The plasma source 120 includes a top cover 124. The dielectric sidewall 122 and top cover 124, integrated with an insert 140 define a plasma source interior 125. Dielectric sidewall 122 can include any suitable dielectric material, such as quartz. An induction coil 130 is disposed proximate (e.g., adjacent) the dielectric sidewall 122 about the plasma source 120. The induction coil 130 is coupled to an RF power generator 134 through any suitable matching network 132. Feed gases are introduced to the plasma source interior from a gas supply 150. When the induction coil 130 is energized with RF power from the RF power generator 134, a plasma is generated in the plasma source 120. In some embodiments, RF power is provided to coil 130 at about 1 kW to about 15 kW, such as about 3 kW to about 10 kW. Induction coil 130 may ignite and sustain a plasma in a wide pressure and flow range. In some embodiments, the plasma processing apparatus 100 includes a grounded Faraday shield 128 to reduce capacitive coupling of the induction coil 130 to the plasma.

To increase efficiency, the plasma processing apparatus 100 includes a gas injection insert 140 disposed in the chamber interior 125. The gas injection channels 151 provide the process gas to the chamber interior 125 through an active zone 172, where due to enhanced confinement of hot electrons a reaction between hot electrons and the feed gas occurs. An enhanced electron confinement region or an active zone 172 is defined by sidewalls of gas injection insert and the vacuum tube in radial direction and by the edge of the bottom surface 180 of the insert from the bottom in vertical direction. The active region 172 provides an electron confinement region within the plasma source interior 125 for efficient plasma generation and sustaining. The narrow gas injection channels 151 prevents plasma spreading from the chamber interior into the gas channel 151. Channels 151 can be about 1 mm in diameter or greater, such as about 10 mm or greater, such as about 1 mm to about 10 mm. The gas injection insert 140 forces the process gas to be passed through the active region 172 where plasma is formed.

The capabilities of the gas injection insert 140 to improve efficiency of the plasma reactor 100 are independent of the material of the gas injection insert 140 as long as the walls that are in direct contact with radicals are made of material with a low recombination rate for the radicals. For instance, in some embodiments, the gas injection insert 140 can be made from a metal, such as an aluminum material, with a coating configured to reduce surface recombination. Alternatively, the gas injection insert 140 can be a dielectric material, such as a quartz material, or an insulative material.

The coil 130 is aligned with the active region in such a way that the top turn of the coil is above the bottom edge 180 of the insert 140 and operates substantially in the active region of the inner volume, while the bottom turn of the coil is below edge 180 and operates substantially outside the active region. The center of the coil is substantially aligned with the edge 180. Within these boundaries one can adjust the coil position for a desired performance. Alignment of the coil with surface edge 180 provides improved source efficiency, namely controlled generation of desired chemical species for plasma processes and delivering them to the wafer with reduced or eliminated losses. For example, plasma sustaining conditions (balance between local generation and loss of ions) might not be the best for generating species for a plasma process. Regarding delivery of the species to the substrate, efficiency can depend on the volume and wall recombination of these particular species. Hence, control of the alignment of the coil with surface edge 180 provides control of the source efficiency for a plasma process.

In some embodiments, a coil has a short transition region near the leads, and the remainder of the coil turns are parallel to the bottom 180, in other embodiments, a coil is helical, but one can always define the top and the bottom turn of the coil. In some embodiments, a coil can have 2-5 turns.

In some embodiments, surface 180 is aligned with a portion of induction coil 130 (e.g., coil loop 182) along axis 184 by utilizing a suitably sized insert 140 (and top plate 124, which may be a preformed part of the insert 140) to form plasma source 120. Alternatively, surface 180 can be movable along a vertical direction $V_1$ relative to plasma source 120 while a remainder portion of insert 140 is static (e.g., fixed) as part of plasma source 120, in order to provide alignment of surface 180 with a portion of coil 130. For example, a mechanism 170 can be coupled with any suitable portion of insert 140 to adjust a position of surface 180 such that a portion of insert 140 having a first length ($L_1$) is adjusted to a second length ($L_2$). Mechanism 170 can be any suitable mechanism, such as an actuator, for example a motor, electric motor, stepper motor, or pneumatic actuator. In some embodiments, a difference ($\Delta$) in length from $L_1$ to $L_2$ is about 0.1 cm to about 4 cm, such as about 1 cm to about 2 cm.

Additionally or alternatively, the insert 140 can be coupled to a mechanism (such as mechanism 170), and mechanism 170 is configured to move the entirety of insert 140 vertically (e.g., along a vertical direction $V_1$ relative to plasma source 120), in order to align surface 180 with a portion of coil 130. Spacers (not shown) can be used to fill gap(s) between insert 140 and another portion of plasma source 120 (such as between top plate 124 and dielectric sidewall 122) that were formed by moving the insert vertically. The spacers may be formed from, for example, a ceramic material, such as a quartz.

In general, positioning coil 130 center above surface 180 will increase the efficiency of ionization and dissociation, but reduces the transport efficiency of these species to the substrate, as many of the species may recombine on the walls of the narrow active region. Positioning the coil 130 below surface 180 can improve plasma delivery efficiency, but may decrease plasma generation efficiency.

Figure 6A:
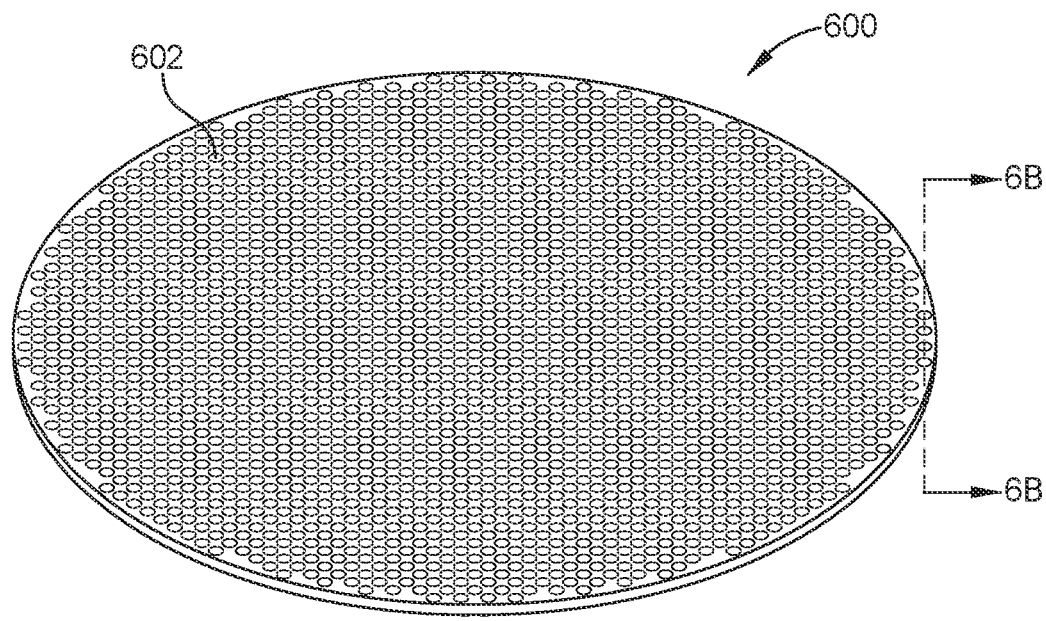
FIG. 6a is an isometric view of a separation grid, according to at least one embodiment.
Figure 6B:
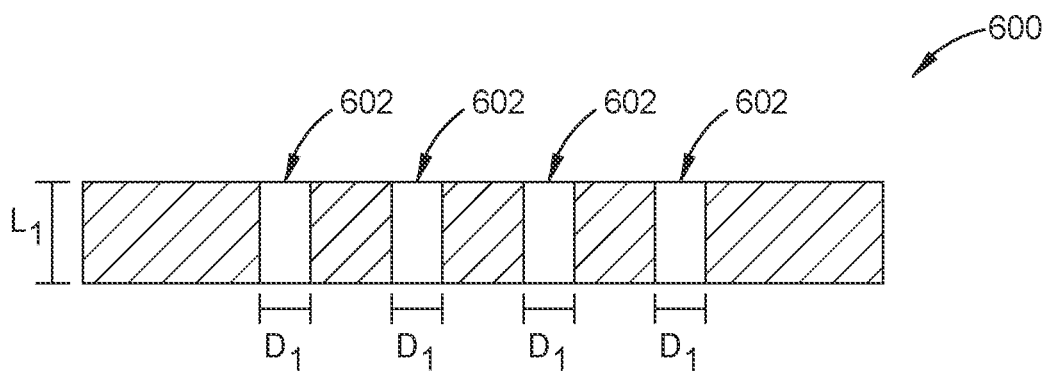
FIG. 6b is a cross-section view (along line 6B) of the separation grid of FIG. 6a, according to at least one embodiment.

Separation grid 116 is configured to separate a processing chamber 110 area from plasma charged particles (ions and electrons), which recombine on the grid, so that only neutral plasma species can pass through the grid into the processing chamber 110. The holes in the bottom section of the separation grid 116 may have different pattern, e.g. uniform 600 as shown in FIGS. 6a, 6b. In some embodiments, separation grid 600 is formed of aluminum, anodized aluminum, quartz, aluminum nitride, aluminum oxide, tantalum, tantalum nitride, titanium, titanium nitride, or combination(s) thereof. For example, AlN can be beneficial for flux of nitrogen radicals, whereas conventional separation grids are more prone to nitrogen radical recombination. Similarly, aluminum oxide can provide flux of oxygen or hydrogen radicals, whereas conventional separation grids are more prone to their recombination. In some embodiments, separation grid 600 has a plurality of holes 602. As shown in FIG. 6b, holes 602 are disposed through the separation grid (e.g., holes 602 traverse the thickness of the separation grid). Holes 602 may have an average diameter of about 4 mm to about 6 mm. In some embodiments, each hole of the plurality of holes 602 has a diameter ($D_1$) of about 4 mm to about 6 mm. In some embodiments, the separation grid 600 of FIGS. 6a, 6b has a thickness of about 5 mm to about 10 mm, which defines the hole length ($L_1$). A ratio of the grid thickness (length ($L_1$)) to the average diameter of the plurality of holes may be greater than about 1, such as about 1 to about 3.

Exhaust 192 is coupled with a side wall of process chamber 110. In some embodiments, exhaust 192 may be coupled with a bottom wall of process chamber 110 to provide azimuthal independence (e.g. if not rotating pedestal). If lamps are rotating, exhaust 192 can be coupled with the side wall, since rotation mitigates azimuthal dependence.

Various features of ICP sources and plasma processing apparatus will now be described with reference to FIGS. 2, 3, 4, and 5. FIGS. 2, 3, 4, and 5 are schematic diagrams of a plasma processing apparatus, according to some embodiments of the present disclosure. Plasma processing apparatus of FIGS. 2, 3, 4, and 5 may be constructed in a similar manner to plasma processing apparatus 100 (FIG. 1) and operate in a manner described above for processing apparatus 100. It will be understood that the components of plasma processing apparatus FIGS. 2, 3, 4, and 5 may also be incorporated into any other suitable plasma processing apparatus in alternative example embodiments.

Figure 2:
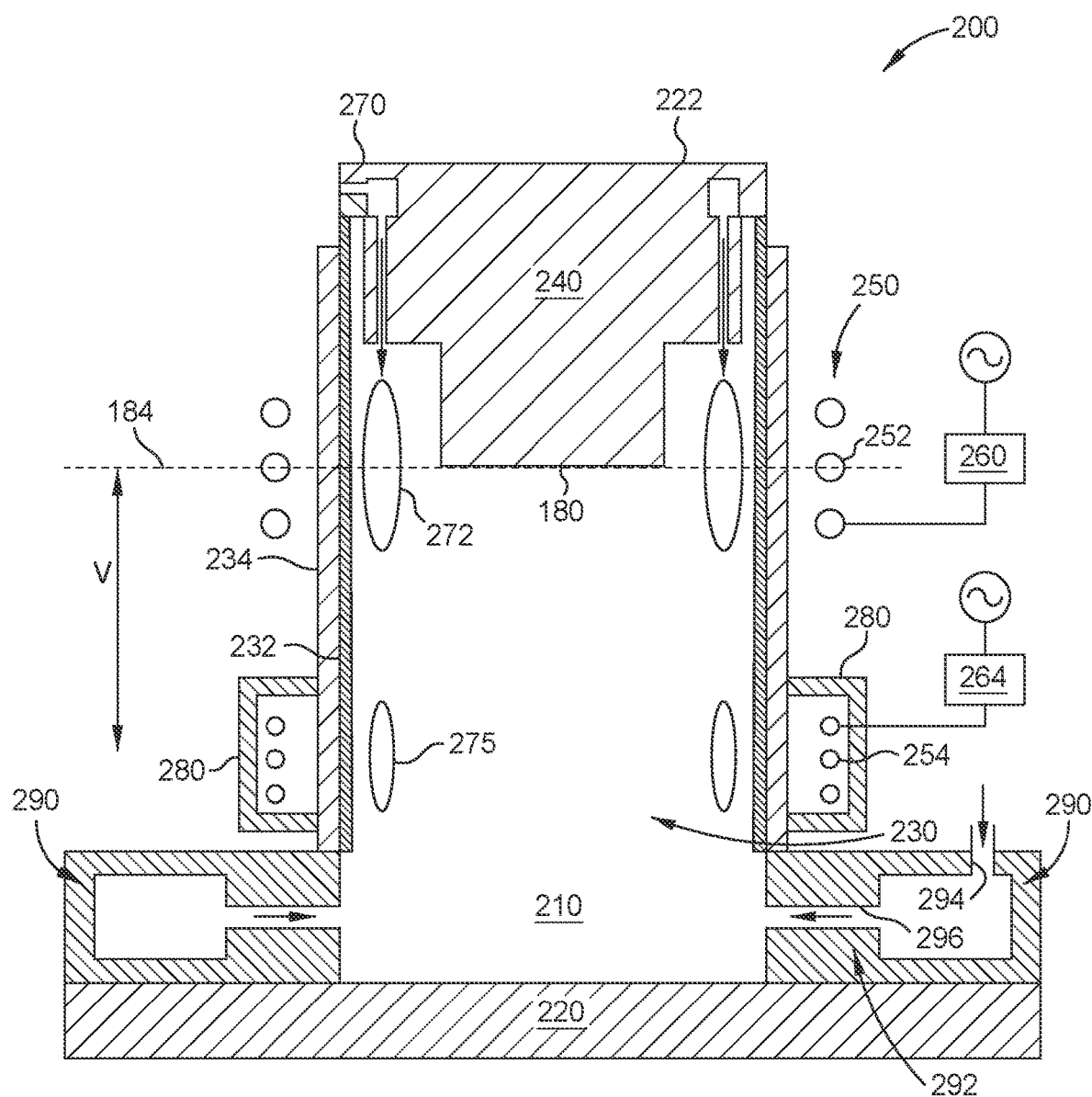
FIG. 2 is a schematic diagram of a plasma processing apparatus, according to at least one embodiment.

As shown in FIG. 2, plasma processing apparatus 200 includes a processing chamber 220 which has a separation grid (not shown) disposed therein. Plasma processing apparatus 200 includes a plasma source 222 along a vertical direction V. A substrate may be positioned in the processing chamber directly below the grid and some distance from the grid, and neutral particles from plasma source interior 230 may flow downward through separation grid toward the substrate in the processing chamber 220, and the neutral particles may contact the substrate to perform a process, e.g., a surface treatment process.

A plurality of induction coils 250 are disposed at a different position along the vertical direction V on plasma source 222, e.g., such that the induction coils (e.g., 252 and 254) are spaced from each other along the vertical direction V along plasma source 222. For example, induction coils 250 may include a first induction coil 252 and a second induction coil 254. First induction coil 252 may be positioned at a first vertical position along a vertical surface of a dielectric sidewall 232. Second induction coil 254 may be positioned at a second vertical position along a vertical surface of the dielectric sidewall 232. The first vertical position is different from the second vertical position. For instance, the first vertical position may be above the second vertical position. In some embodiments, a portion of the first induction coil 252 is substantially aligned with a surface 180 of the insert as was described above. The second induction coil 254 is disposed at a bottom (e.g., lower) portion of plasma source 200. The second induction coil includes magnetic field concentrator(s) 280, allowing a placement of the coil in the bottom of the plasma source, as shown in FIG. 2. The use of magnetic field concentrators 280 increases efficiency of the plasma generation at the bottom of the source and significantly increases the radial control near the substrate (as compared to the absence of magnetic field concentrators). In some embodiments, induction coil 254 is disposed at a bottom ⅓ height, such as a bottom ¼ height, of plasma source 222.

Induction coils 250 (252, 254) may be operable to generate (or modify) an inductive plasma within plasma source interior 230. For example, plasma processing apparatus 200 may include a radio frequency power generator 262 (e.g., RF generator and matching network) coupled with coil 252. Induction coil 254 is coupled to a second RF generator 264 (e.g., RF generator and matching network). The frequency and/or power of RF energy applied by the first RF generator 262 to the first induction coil 252 and the second RF generator 264 to the second induction coil 254, respectively, can be independent in order to better control process parameters of a surface treatment process.

For example, frequency and/or power of RF energy applied by the second RF generator 264 can be less than the frequency and/or power of RF energy applied by the first RF generator 262. Radio frequency power generator 262 is operable to energize induction coil 252 to generate the inductive plasma in plasma source interior 230. In particular, radio frequency power generator 262 may energize induction coil 252 with an alternating current (AC) of radio frequency (RF) such that the AC induces an alternating magnetic and electric fields inside the volume near induction coil 252 that heats electrons to generate the inductive plasma. In some embodiments, RF power is provided to coil 252 at about 1 kW to about 15 kW, such as about 3 kW to about 15 kW. Induction coil 252 may ignite and sustain a plasma in a wide pressure and flow range.

Radio frequency power generator 264 is operable to energize induction coil 254 to generate and/or modify plasma in plasma source interior 230. In particular, radio frequency power generator 264 may energize induction coil 254 with an alternating current (AC) of radio frequency (RF) such that inductive RF electric field inside the volume adjacent to induction coil 254 accelerate electrons to generate plasma. In some embodiments, RF power is provided to coil 254 at about 0.5 kW to about 6 kW, such as about 0.5 kW to about 3 kW. Induction coil 254 may modify the plasma density in the plasma processing apparatus 200, e.g., induction coil 254 can tune the radial profile of the plasma to promote additional plasma uniformity moving toward a substrate in chamber 220. Since coil 252 is further away from a substrate during use than coil 254, the plasma and radicals generated by coil 252 can promote a dome shaped profile near the substrate, and the coil 254 can flatten (or even raise the edge) the dome-shaped plasma profile as plasma approaches the substrate.

A dielectric sidewall 232 is positioned between induction coils 250 and plasma source 222. Dielectric sidewall 232 has a generally cylindrical shape. An electrically grounded Faraday shield 234 may be made of metal and/or is positioned between induction coils 250 and the dielectric sidewall 232. Faraday shield 234 has a cylindrical shape and is disposed about dielectric sidewall 232. The grounded faraday shield 234 extends the length of the plasma source 222. Dielectric sidewall 232 contains plasma within plasma source interior 230 allowing RF fields from induction coils 250 to pass through to plasma source interior 230, and grounded Faraday shield 234 reduces capacitive coupling of the coils 250 to the plasma within plasma source interior 230. In some embodiments, Faraday shield 234 can be a metal cylinder having slots perpendicular to the coil direction. The vertical slots are in the area of the coil (e.g., adjacent the coil), while at least one vertical end of the coil (above or below the coil) has a complete current path around the cylinder. A Faraday shield may have any suitable thickness, and/or the slots may have any suitable shape. Near the coil(s), the slots can be relatively narrow (e.g., about 0.5 cm to about 2 cm) and substantially vertical, even when utilizing a helical coil.

As noted above, each induction coil 250 is disposed at a different position along the vertical direction V on plasma source 222 adjacent a vertical portion of a dielectric sidewall of the plasma source 222. In this way, each induction coil 250 can be operable to generate (or modify) a plasma in a region adjacent to the coil along the vertical surface of the dielectric sidewall 232 of the plasma source 222.

In some embodiments, the plasma processing apparatus 200 includes one or more gas injection ports 270 disposed through a gas injection insert 240 of the plasma source 222, radially outward of the injection insert 240. The gas injection ports 270 and a side shape of the insert are operable to inject process gas at the periphery of the plasma source interior 230, directly into active plasma generation region adjacent the vertical surface of the dielectric sidewall 232. For example, there may be >20 (e.g. 70-200) vertical injection holes disposed through insert 240. For instance, the first induction coil 252 can be operable to generate a plasma in region 272 proximate a vertical surface of the dielectric sidewall 232. The second induction coil 254 can be operable to generate or modify a plasma present in region 275 proximate a vertical surface of the dielectric sidewall 232. The gas injection insert 240, in some embodiments, can further define an active region for generation of the plasma in the plasma source interior 230 adjacent the vertical surface of the dielectric sidewall 232. A top portion of a gas injection insert of the present disclosure can have a diameter of about 10 cm to about 15 cm. A bottom portion of a gas injection insert of the present disclosure can have a diameter of about 7 cm to about 10 cm.

Plasma processing apparatus 200 can have a bottom edge gas injection port 290 configured to introduce the same or different gas to volume 210 as the gas injection port 270 provides to plasma source interior 230. Edge gas injection port 290 is coupled with process chamber 220 and is a top plate of the process chamber 220. Edge gas injection port 290 includes a circular plenum 292 to which gas is introduced through inlet 294. Gas flows from the plenum 292 through one or more openings 296 to the volume 210. Edge gas injection port 290 can provide fine tuning of the plasma chemistry near the edge of a substrate, and/or improve plasma uniformity at the substrate. For example, edge gas injection port 290 can provide modification of the flow (same gas), and/or modification of chemistry (chemical reaction between plasma radicals and new feed gas or different gases).

Plasma processing apparatus 200 has improved source tunability relative to known plasma processing apparatus. For example, induction coils 250 can be positioned in two locations along the vertical surface of the dielectric sidewall 232 such that functions of the top coil 252 proximate to the active plasma generation region are plasma ignition and sustaining in the plasma source interior 230, and functions of the second coil 254 placed at the bottom of the source allow the advantageous source tunability. The low positioning of the second coil is possible due to the use of magnetic field concentrators 280, which provides coupling of the coil to plasma rather than to surrounding metal (e.g., 290). In such a manner, a treatment process performed with plasma processing apparatus 200 on a substrate may be more uniform.

Figure 3:
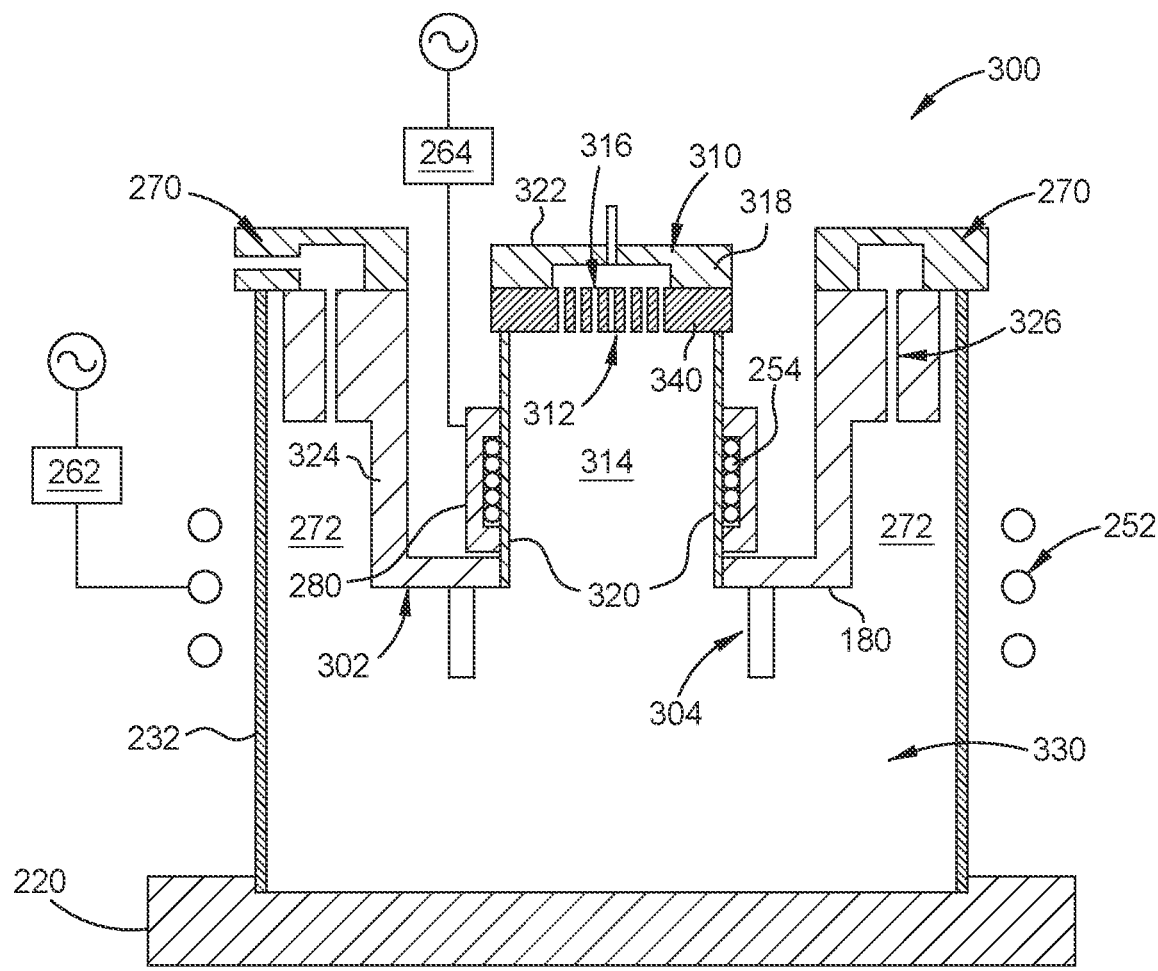
FIG. 3 is a schematic diagram of a plasma processing apparatus, according to at least one embodiment.

FIG. 3 is a schematic diagram of a plasma processing apparatus 300. Processing apparatus 300 includes plasma source 322 and processing chamber 220. Plasma source 322 includes insert 302 having a peripheral gas injection port 270 and center gas injection port 310. Center gas injection port 310 is formed by top plate 318 and bottom plate 340 forming a plenum 316. Bottom plate 340 has a plurality of holes (throughholes) 312 to enable the center gas injection port 310/insert 302 to have a plurality of the holes (throughholes) 312 for providing process gas into center process region 314. The dimensions of center process region 314 are provided by portions of insert 302, namely center gas injection port 310 and sidewall 320. Sidewall 320 has a cylindrical shape and is a dielectric material. For example, the sidewall 320 is formed from quartz or alumina. The dimensions of peripheral process region 272 are provided by dielectric sidewall 232 and insert 302, namely gas injection port 270 and sidewall 324. Sidewall 324 (and insert 302 in general) can have a cylindrical shape. Sidewall 324 surface material can be a dielectric material or a metal. For example, the sidewall 324 is formed from aluminum and may be covered with quartz, or alumina, or have bare or anodized aluminum surface. In addition, a first Faraday shield (not shown) can be disposed between coil 252 and dielectric sidewall 232. Likewise, a second Faraday shield (not shown) can be disposed between coil 254 and sidewall 320. In some embodiments, sidewall 320 is quartz or ceramic and/or has a thickness of about 2.5 mm to about 5 mm.

A flow rate of process gas provided by peripheral gas injection port 270 via conduit 326 to peripheral process region 272 can be greater than a flow rate of process gas provided by center gas injection port 310 to center process region 314. In some embodiments, a ratio of flow rate of process gas provided by peripheral gas injection port 270 to a flow rate of process gas provided by center gas injection port 310 is about 2:1 to about 20:1, such as about 5:1 to about 10:1. Providing a higher flow rate to peripheral process region 272 than a flow rate to center process region 314 provides improved center-edge uniformity of a plasma at a substrate surface of a substrate present in processing chamber 220.

Processing apparatus 300 further includes peripheral coil 252 and center coil 254. An RF power provided by peripheral coil 252 can be greater than an RF power provided by center coil 254. In some embodiments, a ratio of RF power provided by peripheral coil 252 to RF power provided by center coil 254 is about 2:1 to about 20:1, such as about 3:1 to about 10:1, such as about 5:1. If the center coil is not energized, the secondary plasma source serves as auxiliary gas injection that reduces fluxes of radicals and ions/electrons created by the main coil 252 toward the center of the substrate. Because plasma density is typically higher at a center of a substrate during conventional plasma processes, providing a greater RF power to peripheral induction coil 254 than RF power provided to center induction coil 252 promotes increased plasma density at an edge portion(s) of the substrate, improving plasma uniformity. Plasma separators 304 (cylindrical protrusions) between central and edge areas improve the capability of independent central-edge plasma control.

Peripheral coil 252 and center coil 254 may be operable to generate (or modify) an inductive plasma within plasma source interior 330. For example, plasma processing apparatus 300 may include a radio frequency power generator 262 (e.g., RF generator and matching network) coupled with peripheral coil 252. Center coil 254 is coupled to a second RF generator 264 (e.g., RF generator and matching network). The frequency and/or power of RF energy applied by the first RF generator 262 to the peripheral coil 252 and the second RF generator 264 to the center coil 254, respectively, can be adjusted to be the same or different to control process parameters of a substrate treatment process.

For example, frequency and/or power of RF energy applied by the second RF generator 264 can be less than the frequency and/or power of RF energy applied by the first RF generator 262. Radio frequency power generator 262 is operable to energize peripheral coil 252 to generate the inductive plasma in plasma source interior 330. In particular, radio frequency power generator 262 may energize peripheral coil 252 with an alternating current (AC) of radio frequency (RF) such that the AC induces an alternating magnetic field inside peripheral coil 252 that heats a gas to generate the inductive plasma. In some embodiments, RF power is provided to the peripheral coil 252 at about 1 kW to about 15 kW, such as about 3 kW to about 10 kW.

Radio frequency power generator 264 is operable to energize center coil 254 to generate and/or modify an inductive plasma in center region 314 of plasma source 322. In particular, radio frequency power generator 264 may energize center coil 254 with an alternating current (AC) of radio frequency (RF) such that the AC induces an alternating magnetic field inside induction coil 254 that heats a gas to generate and/or modify the inductive plasma. In some embodiments, RF power is provided to center coil 254 at about 0.3 kW to about 3 kW, such as about 0.5 kW to about 2 kW. Center coil 254 may modify the plasma in the plasma processing apparatus 300, e.g., center coil 254 can tune the radial profile of the plasma to promote additional plasma uniformity moving toward a substrate in chamber 220.

In some embodiments, the plasma processing apparatus 300 includes a gas injection port 270 operable to inject process gas at the periphery of the region 272 along a vertical surface of the dielectric sidewall 232, defining active plasma generation region(s) adjacent the vertical surface of the dielectric sidewall 232. For instance, the peripheral coil 252 can be operable to generate a plasma in region 272 proximate a vertical surface of the dielectric sidewall 232. The center coil 254 can be operable to generate and/or modify a plasma present in a center region 314 proximate a vertical surface of the sidewall 320. The gas injection insert 302, in some embodiments, can further define an active region for generation of the plasma in the plasma source interior adjacent the vertical surface of the dielectric sidewall 232 and the vertical surface of the sidewall 320.

In practice, the substrate can be provided some overlap of the process plasma formed in region 314 with the process plasma formed in region 272. Overall, peripheral and center process gas injection ports (270, 310) and induction coils (252, 254) can provide improved plasma and process uniformity (center-to-edge plasma control) for treating a substrate with a plasma. To enhance center-to-edge process control, insert 302 includes a separator 304. Separator 304 may be a uniform cylindrical separator coupled with (e.g., disposed along) inert bottom surface 180.

In addition, in embodiments where the process gas provided by center gas injection port 310 is different than process gas provided by peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (e.g., some embodiments of region 272) with a flow of different plasma rich on different kind of plasma species, e.g. different radicals. In addition, formation of these unique plasma chemistries can be obtained in embodiments utilizing alignment of surface 180 with a portion of coil 252, e.g., as described above.

Figure 4:
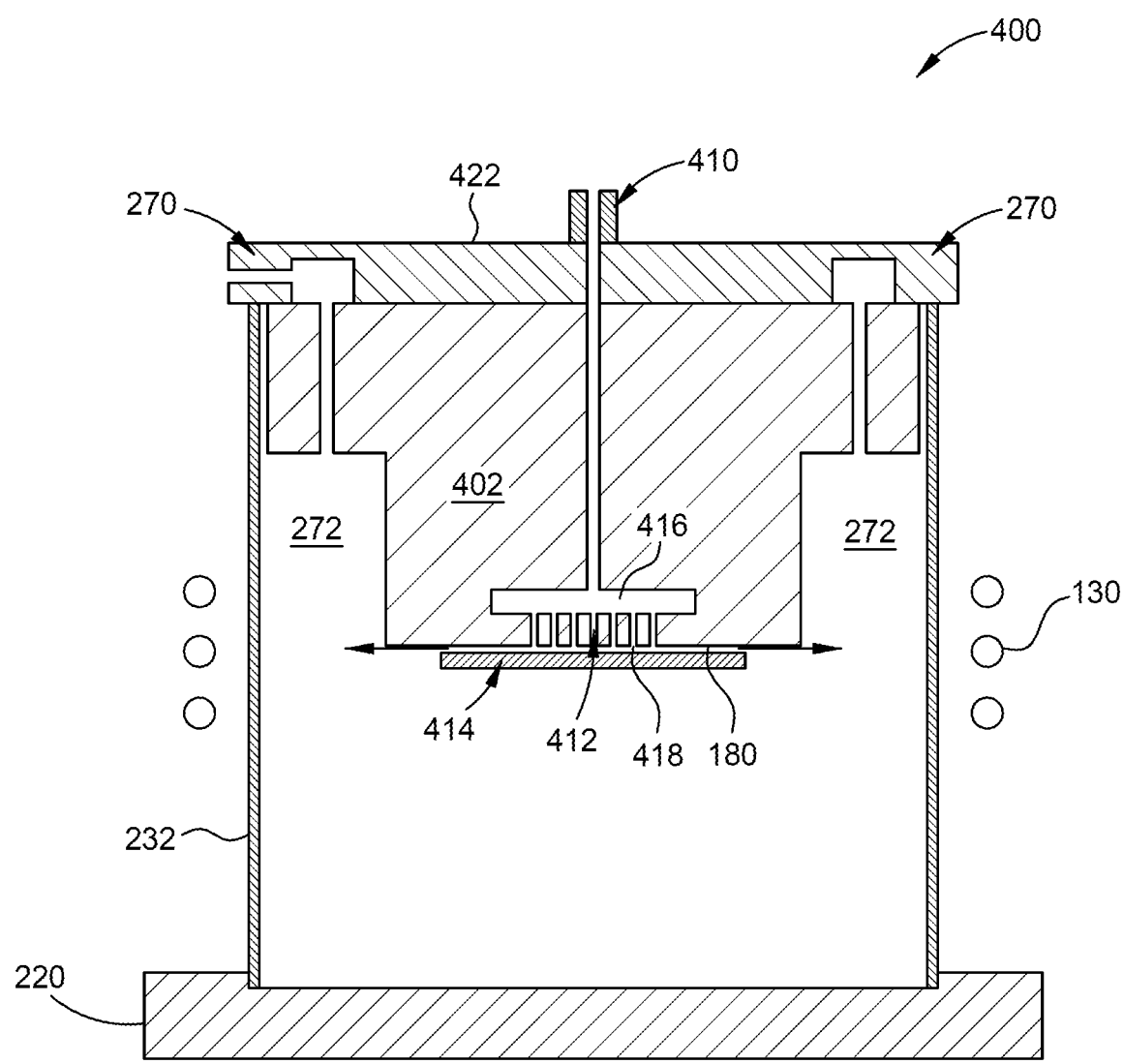
FIG. 4 is a schematic diagram of a plasma processing apparatus, according to at least one embodiment.

FIG. 4 is a schematic diagram of a plasma processing apparatus 400. Plasma processing apparatus 400 includes plasma source 422. Plasma source 422 includes gas injection insert 402, which can be integrated with the top cover, peripheral gas injection port 270, and center gas injection port 410. Center gas injection port 410 is disposed within gas injection insert 402 to fluidly couple center gas injection port 410 with a gas distribution plenum 416 of gas injection insert 402. Gas distribution plenum 416 provides an increased diameter (as compared to a diameter of port 410) for a process gas to distribute uniformly before the process gas enters the exhaust region between the bottom of the insert 180 and the distribution platform 414. Once the gas is provided through holes 412, platform 414 provides a second gas distribution plenum 418 and promotes an outward flow of the gas to a periphery (e.g., into regions 272) of plasma source 422. In some embodiments of the present disclosure, the material to form holes 412 is absent and a larger plenum is formed. Platform 414 can be coupled with insert 402 via a plurality of screws or bolts (not shown). Platform 414 can be made of quartz or ceramic. Platform 414 can have any suitable design, which allows different materials. The outward/sideways flow of gas promoted by platform 414 can affect the flow profile of gas/plasma to a substrate during processing, improving center-to-edge uniformity, as compared to conventional plasma process apparatus. In addition, this outward flow of the gas to a region adjacent to a plasma generation region (e.g., 272) of plasma source 400 provides benefits. Because high plasma density can be created in a region 272 adjacent to the top part of the coil 130, the electric field does not penetrate far away from the coil, so the gas from the center injection 410-416-414 does not experience a lot of ionization or dissociations, but the gas interacts chemically with high density radicals and ions created in the active region 272. Both radicals and ions are active chemically and interact with a new feed gas from the center injection 410-416-414. The new feed gas, radicals, and ions may create new plasma chemistries as compared to conventional plasma sources using a plasma process chamber. For example, a unique mix of plasma can be created if one mixes a plasma generated flow of radicals and excited species (e.g., some embodiments of region 272) with a new flow of gas that didn't pass through the plasma generation region 272 with hot electrons (e.g., the process gas provided by injection port 410 and platform 414/region 418). For example, one can mix flow of H$^+$ and H-radicals obtained in plasma from the H$_2$ feed gas (e.g., from gas provided by injection port 270) with a flow of oxygen O$_2$ (e.g., from gas provided by injection port 410), where one can significantly increase fraction of HO$_2$, HO, H$_2$O$_2$ and other non-equilibrium molecules, etc. in the region adjacent to active region 272 related to induction coil 130. In addition, formation of these unique plasma chemistries can be obtained in embodiments utilizing alignment of surface 180 edge with a portion of coil 130, e.g., as described above.

In some embodiments, a ratio of flow rate of process gas provided by peripheral gas injection port 270 to a flow rate of process gas provided by center gas injection port 410 is about 20:1 to about 1:20, such as about 10:1 to about 1:10, such as about 2:1 to about 1:2, such as about 1.2:1 to about 1:1.2, such as about 1:1. Such flow rates may provide a stoichiometry (e.g., substantially equimolar amounts) of the different process gases to provide desired densities of chemical species in a plasma formed in regions 272.

In addition, the outward/sideways flow provided by center gas injection port 410 and platform 414/region 418 can modify flow patterns within the plasma source 400 affecting delivery profile of radicals to the substrate. For example, in embodiments where the process gas provided by center injection port 410 is substantially the same as the process gas provided by peripheral injection port 270, more plasma flow is promoted toward an edge of a substrate, improving the center-edge plasma profile (e.g., uniformity of plasma provided to the substrate).

In addition, in embodiments where the process gas provided by center gas injection port 410 is different than process gas provided by peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (e.g., some embodiments of region 272) with a new flow of gas that didn't pass through the plasma region with hot electrons. For example, one can mix flow of H$^+$ and H-radical obtained in plasma from the H$_2$ feed gas with a flow of oxygen O$_2$, where one can generate a large number of different radicals like HO$_2$, H$_2$O$_2$ molecules, etc. in a region of plasma processing apparatus 400 that is downstream of regions 272. In addition, formation of these unique plasma chemistries can be obtained in embodiments utilizing alignment of surface 180 with a portion of coil 252, e.g., as described above.

Figure 5:
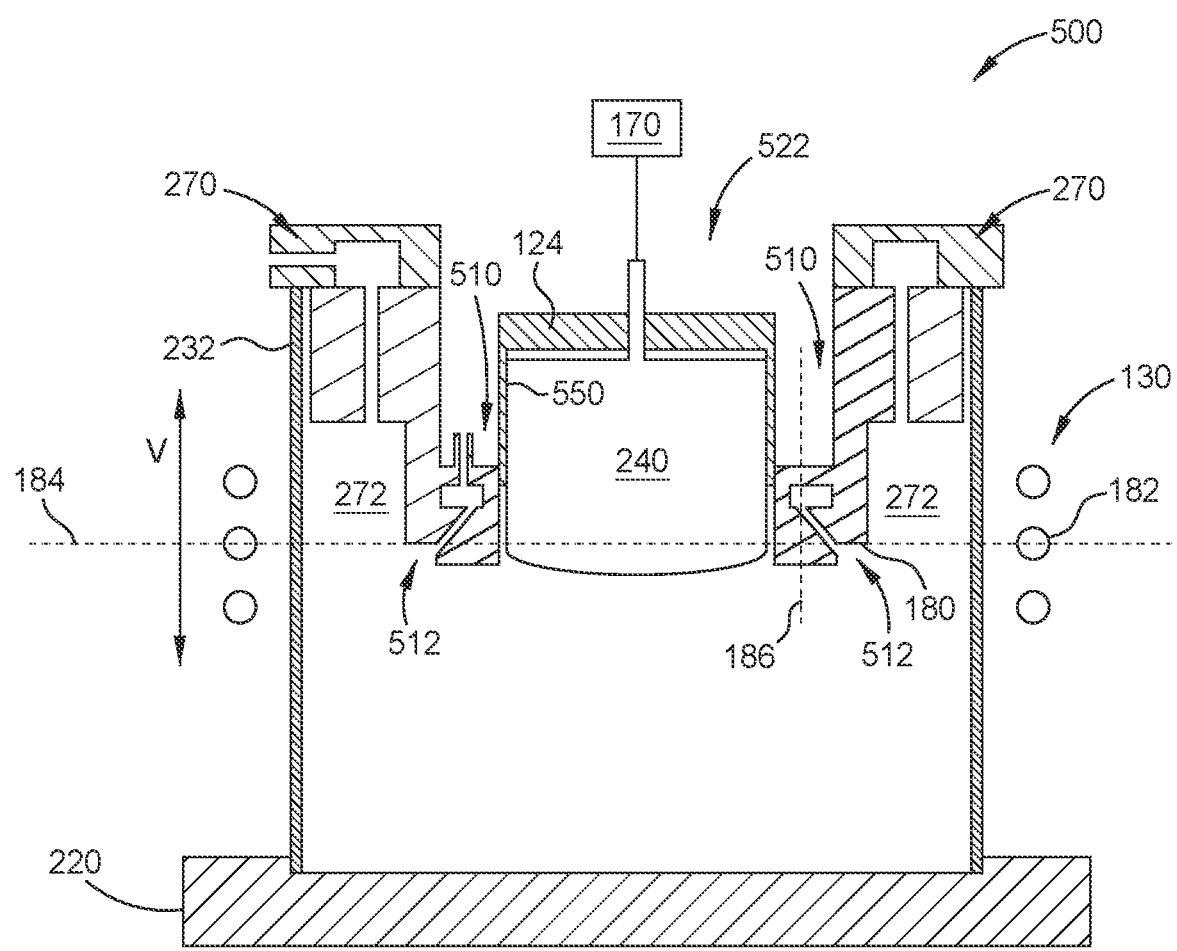
FIG. 5 is a schematic diagram of a plasma processing apparatus, according to at least one embodiment.

FIG. 5 is a schematic diagram of a plasma processing apparatus 500. Processing apparatus 500 includes plasma source 522 and processing chamber 220. Plasma source 522 includes gas injection insert 240, peripheral gas injection port 270, center gas injection port 510, and top plate 124. Center gas injection port 510 can be disposed proximate (e.g., adjacent) a wall 550. Center gas injection includes a port 510 having a generally cylindrical plenum/manifold and plurality of angled injection outlets 512 uniformly spread along the plenum. Gas injection insert 240 can likewise have a generally cylindrical shape. Center gas injection port 510 has angled outlet 512 to promote outward/sideways flow of process gas provided by center injection port 510 and angled outlets 512. Angled outlets 512 can have an angle of about 0 degree to about 90 degrees, such as about 30 degrees to about 60 degrees, such as about 45 degrees, relative to a vertical axis (such as vertical axis 186, which is parallel to an axial centerline of processing apparatus 500 and/or the axial centerline of the plasma source 522).

The outward/sideways flow of gas promoted by angled outlet 512 can affect the flow profile of gas/plasma to a substrate during processing, improving center-to-edge uniformity, as compared to conventional plasma process apparatus. In addition, because a high plasma density can be created in a region adjacent coil 130 (and the electric field does not penetrate far away from the coil), new plasma chemistries can be obtained as compared to conventional plasma processes using a plasma process chamber. For example, a unique mix of plasma can be created if one mixes a plasma generated flow of radicals and excited species (e.g., some embodiments of region 272) with a new flow of gas that didn't pass through the plasma region with hot electrons (e.g., the process gas provided by injection port 510 and angled outlet 512). For example, one can mix flow of $H^+$ and H-radicals obtained in plasma from the $H_2$ feed gas (e.g., from gas provided by injection port 270) with a flow of oxygen $O_2$ (e.g., from gas provided by injection port 510), where one can generate molecular radicals like $HO_2$, $H_2O_2$, etc. in process region 272 adjacent induction coil 130. In addition, formation of these unique plasma chemistries can be obtained in embodiments utilizing alignment of coil 130 with surface edge 180, as described above.

In some embodiments, a ratio of flow rate of process gas provided by peripheral gas injection port 270 to a flow rate of process gas provided by center gas injection port 510 is about 2:1 to about 1:2, such as about 1.2:1 to about 1:1.2, such as about 1:1. Such flow rates may provide a stoichiometry (e.g., substantially equimolar amounts) of the different process gases to provide desired densities of chemical species in a plasma formed in regions 272.

In addition, the outward/sideways flow provided by center gas injection port 510 and angled outlets 512 can modify flow patterns within the plasma source 500 affecting delivery profile of radicals to the substrate. For example, in embodiments where the process gas provided by center injection port 510 is substantially the same as the process gas provided by peripheral injection port 270, more plasma flow is promoted toward an edge of a substrate, improving the center-edge plasma profile (e.g., uniformity of plasma provided to the substrate).

Furthermore, gas injection insert 240 of FIG. 5 has a fixed edge at the bottom surface 180, defining the active region that marks the alignment level 184 for the induction coil 130. The coil 130 is substantially aligned with surface 180 in such a way that the top turn of the coil is positioned above the level 184 (edge 180), and the bottom turn is positioned below the edge. One may further adjust position of the coil within this range based on the process results. Alignment of coil vertical center with surface 180 provides improved source efficiency, namely controlled generation of desired chemical species for plasma processes and delivering them to the wafer with minimum losses. For example, plasma sustaining conditions (balance between local generation and loss of ions) might not work well for generating species for a plasma process. Regarding delivery of the species to the substrate, efficiency can depend on the volume and wall recombination of these particular species. Hence, control of the alignment of the coil 130 with the edge (surface) 180 provides control of the source efficiency for a plasma process.

In some embodiments, a bottom surface of insert 240 is aligned with the bottom edge portion 180 of the insert defining the active region for the coil (this alignment level is shown as axis 184) by utilizing a suitably sized insert 240 to form plasma source 120. Alternatively, the bottom surface of the insert 240 can be made flexible using a movable central part as shown in FIG. 5 of the insert 240, while a remainder portion of insert 240 is fixed as part of plasma source 120. For example, a mechanism 170 can be electronically coupled with the central part of insert 240 to adjust the central part such that the central part of insert 240 having a first position is adjusted to a second position. In some embodiments, a difference (Δ) in position from the first position to the second position is about 0.1 cm to about 10 cm, such as about 1 cm to about 2 cm. Mechanism 170 can be any suitable mechanism, such as an actuator, for example a motor, electric motor, stepper motor, or pneumatic actuator. Movement of the central part of the insert 240 by mechanism 170 increases or decreases a space between the central part and top plate 124.

In general, moving the central part of the insert 240 downward along a vertical direction V will reduce the flow of active species toward the center of the substrate and thus decrease the process rate in the center vs. edge, while moving the central part upward will increase the process rate in the center vs. edge.

Although the Figures have been described independently, it is to be understood that one or more embodiments from one Figure may be beneficially incorporated with one or more embodiments of a different Figure. For example, gas injection insert 140 of FIG. 1 or gas injection insert 240 of FIG. 2 may be gas injection insert 302 of FIG. 3, gas injection insert 402 of FIG. 4, or the configuration of gas injection insert 240 and center gas injection port 510 of FIG. 5. As another non-limiting example, gas injection port 290 may be included as an embodiment with the plasma processing apparatus 300 of FIG. 3, plasma processing apparatus 400 of FIG. 4, and plasma processing apparatus 500 of FIG. 5.

Figure 7:
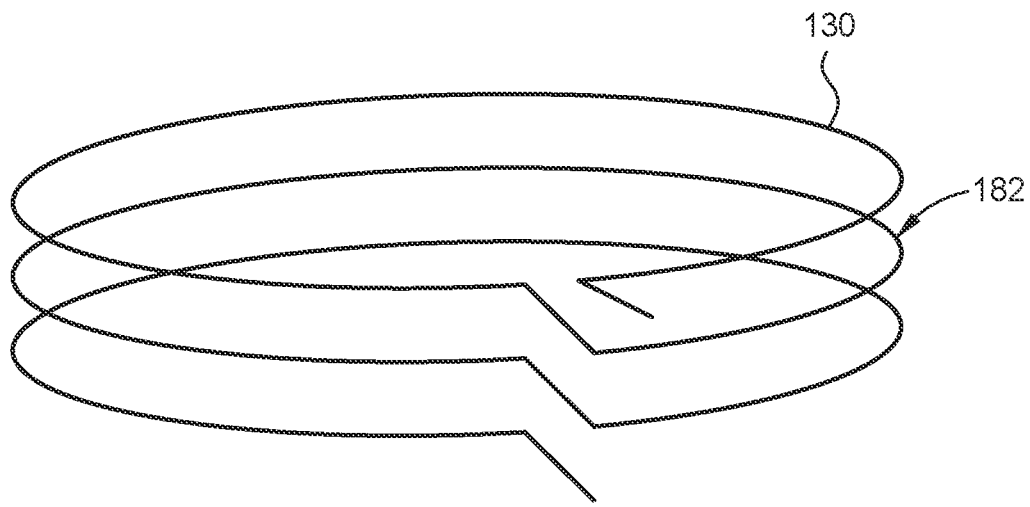
FIG. 7 is an induction coil that can be used with a plasma source, according to at least one embodiment.

FIG. 7 is an induction coil 130 that can be used with a plasma source. Induction coil 130 includes a plurality of coil loops including coil loop 182. The induction coil 130 includes 3 complete coils, but more or less coils are contemplated. For example, an induction coil may have 2-6 complete turns for RF frequency of 13.56 MHz. More turns may be utilized for lower RF frequency.

Figure 8:
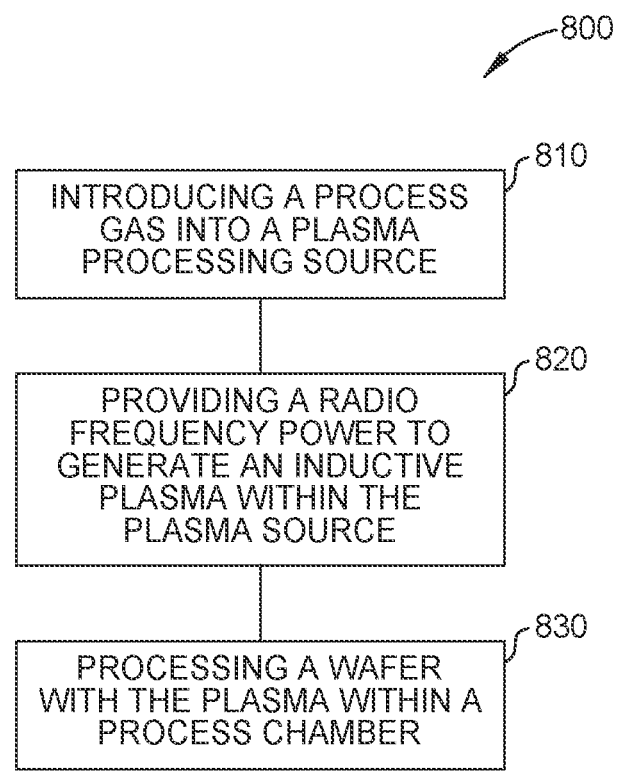
FIG. 8 is a flow diagram of a process, according to at least one embodiment.

FIG. 8 is a flow diagram of a method 800 for plasma processing a substrate with a plasma processing apparatus of the present disclosure. Method 800 may include introducing 810 a process gas into a plasma processing source. The process gas and flow rate thereof may be selected based on a particular substrate processing application. In general, the process gas may include at least one of $N_2$, $NH_3$, $O_2$, $H_2$, or He, and the flow rate may be about 100 sccm to about 3000 sccm. However, other process gases and other flow rates are contemplated. The method 800 further includes providing 820 a radio frequency power to generate an inductive plasma within the plasma source. The radio frequency power may be controlled based on the particular substrate processing application. In general, the radio frequency power may be about 1 kW to about 10 kW, however other power levels are also contemplated. From an interior region of the plasma source, neutral particles and/or radicals of the inductive plasma flow through a separation grid to the substrate within a processing chamber. Although a separation grid is shown in FIG. 1, the method 800 may be carried out without a separation grid.

The method 800 further includes processing 830 the substrate within the process chamber. The temperature and pressure of the processing chamber can be controlled based on the particular substrate processing application. In general, the temperature may be about 200° C. to about 1200° C., and the pressure may be about 0.25 Torr to about 5 Torr.

However, other temperatures and pressures are contemplated. The substrate in the processing chamber may be exposed to neutral particles and/or radicals generated in the inductive plasma that pass through the separation grid. In particular, the plasma, including neutral particles and/or radicals contained therein, contacts a first side of the substrate facing the plasma source. In some embodiments, the substrate is heated using a plurality of lamps disposed opposite the first side of the substrate. The neutral particles and/or radicals can be used, for instance, as part of a surface treatment process of the substrate. In practice, gas flow rates and/or gas ratios may be selected so that the surface of the substrate is saturated with the reactant supply of neutral particles and/or radicals. The capability of the apparatus disclosed herein to provide for surface saturation of the reactive species is attributed to a very high density source and a shortened distance between the plasma source and the substrate.

In plasma processing operations without surface saturation, the arrival rate of the reactive species to the substrate surface determines the rate of reaction and/or incorporation of the reactive species. However, using apparatus and/or methods disclosed herein, reactive species are saturated on the surface due to high species flux such that diffusion of the reactive species becomes the dominating factor. Since temperature determines the diffusion of the reactive species and drives the reaction, the reaction is temperature-dependent. Because thermal energy is conformal in nature, being substantially uniform in three-dimensions, methods disclosed herein, which are controlled based on temperature, produce a more conformal surface treatment compared to plasma processing operations in which the arrival rate of the reactive species is rate determining.

In general, processing times for the operation 830 may be about 10 seconds to about 10 minutes depending on the particular substrate processing application, however other processing times are also contemplated. Numerous benefits of the method 800 will be described in greater detail below with regard to each exemplary substrate processing application. It will be appreciated that the method 800 can be performed using any of the plasma processing apparatus of the present disclosure.

The plasma can be generated by energizing one or more induction coils proximate the plasma source with RF energy to generate a plasma using a process gas introduced into the plasma source. For instance, process gas can be admitted into the plasma source from a gas source. RF energy from RF source(s) can be applied to induction coil(s) to generate a plasma in the plasma source.

In general, the method 800 can be used for an array of different substrate processing applications including without limitation, nitrogen radical treatment (e.g., nitridation), oxygen radical treatment (e.g., oxidation), hydrogen radical treatment, helium radical treatment, and various pre- and post-treatments.

In certain embodiments, the plasma processing apparatus of the present disclosure may be used for silicon oxide (e.g., $SiO_2$) nitridation according to the method 800. In certain examples, a substrate undergoing the nitridation process can include a layer of silicon oxide having a thickness of about 10 angstroms to about 200 angstroms. During silicon oxide nitridation, at least one of diatomic nitrogen ($N_2$), ammonia ($NH_3$) or a mixture thereof, is introduced to the plasma processing source to generate nitrogen and/or NH radicals. In embodiments using $N_2$ source gas, the flow rate of $N_2$ is about 100 sccm to about 500 sccm, such as about 300 sccm. In embodiments using a mixture of $N_2$ and $NH_3$ source gases, a ratio of $N_2$ to $NH_3$ is about 3:1 to about 1:3, such as about 3:1 to about 1:1, such as about 1:1, such as about 1:1 to about 1:3. In some embodiments, which may be combined with other embodiments, the source gas is mixed with an inert gas (e.g., argon gas (Ar)).

During silicon oxide nitridation, the process chamber can be run either hot (e.g., greater than 250° C.) or cold (e.g., 250° C. or less). In certain embodiments which may be combined with other embodiments, the temperature in the process chamber is about 200° C. or greater, such as about 200° C. to about 1200° C., such as about 250° C. to about 950° C., such as about 200° C. to about 250° C., such as about 250° C., such as about 250° C. or greater, such as about 500° C. to about 1000° C., such as about 500° C. to about 600° C., such as about 600° C. to about 700° C., such as about 700° C. to about 800° C., such as about 800° C. to about 900° C., such as about 850° C., such as about 900° C. to about 1000° C., such as about 950° C. The pressure in the process chamber is about 0.2 Torr to about 3 Torr, such as about 0.5 Torr to about 2 Torr, such as about 0.5 Torr, such as about 1 Torr, such as about 2 Torr. The radio frequency power is about 1 kW to about 10 kW, such as about 1 kW to about 5 kW, such as about 2 kW, such as about 2 kW to about 8 kW, such as about 5 kW to about 10 kW, such as about 8 kW. The processing time is within a range of about 2 minutes to about 8 minutes, such as about 4 minutes to about 5 minutes, such as about 4 minutes, such as about 5 minutes.

Beneficially, silicon oxide nitridation performed using the plasma processing apparatus and method of the present disclosure increases nitrogen content in silicon oxide relative to rapid thermal nitridation processes at approximately the same level of nitrogen conformality. Moreover, the silicon oxide nitridation processes described herein also increase nitrogen conformality in silicon oxide relative to ion driven decoupled plasma nitridation processes. Silicon oxide nitridation described herein forms peaks in nitrogen content at both the silicon-silicon oxide interface and the silicon oxide surface due to diffusion of nitrogen and/or NH radicals from the surface to the interface. Furthermore, the silicon oxide nitridation described herein can increase conformality on gate all around (GAA) semiconductor structures.

In another example, the plasma processing apparatus of the present disclosure may be used for silicon (Si) nitridation according to the method 800. In certain examples, a substrate undergoing the nitridation process can include a layer of silicon which can be treated with nitrogen radicals to form a conformal layer of silicon nitride (e.g., SiN). In some embodiments of silicon nitridation, diatomic nitrogen ($N_2$) is introduced to the plasma processing source to generate nitrogen radicals. In embodiments using $N_2$ source gas, the flow rate of $N_2$ is about 500 sccm to about 1500 sccm, such as about 1000 sccm. In some embodiments, which may be combined with other embodiments, the source gas is mixed with an inert gas (e.g., Ar).

During silicon nitridation, the process chamber can be run either hot (e.g., greater than 250° C.) or cold (e.g., 250° C. or less). In certain embodiments, which may be combined with other embodiments, the temperature in the process chamber is about 200° C. or greater, such as about 200° C. to about 1200° C., such as about 250° C. to about 950° C., such as about 200° C. to about 250° C., such as about 250° C., such as about 250° C. or greater, such as about 500° C. to about 1000° C., such as about 500° C. to about 600° C., such as about 550° C., such as about 600° C. to about 700° C., such as about 700° C. to about 800° C., such as about 800° C. to about 900° C., such as about 900° C. to about 1000° C., such as about 950° C. The pressure in the process chamber is about 0.2 Torr to about 3 Torr, such as about 0.3 Torr to about 2 Torr, such as about 0.3 Torr, such as about 2 Torr. The radio frequency power is about 1 kW to about 10 kW, such as about 1 kW to about 5 kW, such as about 2 kW. The processing time is within a range of about 0.25 minutes to about 8 minutes, such as about 0.5 minutes to about 5 minutes, such as about 0.5 minutes, such as about 2 minutes, such as about 4 minutes, such as about 5 minutes.

Beneficially, silicon nitridation performed using the plasma processing apparatus and method of the present disclosure can form a conformal layer of silicon nitride having a thickness of about 20 angstroms to about 60 angstroms. In one example, the silicon nitridation described herein enables formation of substantially conformal nitrogen content on top and bottom sidewalls of polysilicon in an oxide/polysilicon (OPOP) stack with, for example, 2.8 μm depth and aspect ratio from 20:1 to 30:1.

In another example, the plasma processing apparatus of the present disclosure may be used for tungsten (W) nitridation according to the method 800. In certain examples, a substrate undergoing the nitridation process includes a layer of tungsten which can be treated with nitrogen radicals to form a conformal layer of tungsten nitride (e.g., WN). During the tungsten nitridation, $N_2$ source gas is introduced to the plasma processing source to generate nitrogen radicals. The flow rate of $N_2$ is about 500 sccm to about 1500 sccm, such as about 1000 sccm. In some embodiments, which may be combined with other embodiments, the source gas is mixed with an inert gas (e.g., Ar). It is contemplated that other nitrogen source gases may be utilized.

During tungsten nitridation, the temperature in the process chamber is about 800° C. or less, such as about 700° C. or less, such as about 500° C. to about 700° C., such as about 500° C. to about 600° C., such as about 600° C. to about 700° C., such as about 650° C. Using apparatus and/or methods disclosed herein, the temperature and nitrogen content of processed films are inversely correlated. For example, operation of the process chamber at temperatures of about 850° C. or greater result in only about 5% nitrogen content or less, whereas temperatures of about 780° C. or less increase nitrogen content to about 25%, a 5-fold increase. Moreover, operation of the process chamber at a temperature of about 750° C. results in nitrogen content between about 25% and about 30%. Further reduction of the temperature to about 650° C. further increases nitrogen content to between about 30% and about 35%, and even further reduction of the temperature to about 550° C. may further increase nitrogen content to between about 35% and about 40%. During tungsten nitridation, the pressure in the process chamber is about 0.5 Torr to about 3 Torr, such as about 2 Torr. The radio frequency power is about 1 kW to about 10 kW, such as about 1 kW to about 5 kW, such as about 2 kW. The processing time is within a range of about 2 minutes to about 8 minutes, such as about 5 minutes. Beneficially, tungsten nitridation performed using the plasma processing apparatus and method of the present disclosure results in a conformal layer of tungsten nitride having a thickness of about 25 angstroms to about 30 angstroms.

In another example, the plasma processing apparatus of the present disclosure may be used for hydrogen radical treatment of tungsten (W) according to the method 800. In such an example, a substrate undergoing the hydrogen radical treatment process includes a blanket layer of tungsten deposited on a layer of titanium nitride (e.g., TiN). In such an example, the tungsten layer may be formed, for example, by atomic layer deposition (ALD). The blanket layer of tungsten has a thickness of about 600 angstroms to about 650 angstroms, however, other thicknesses are contemplated. Using apparatus and/or methods disclosed herein, treatment of tungsten with hydrogen radicals reduces interfacial fluorine (F) content. For example, when a substrate includes tungsten deposited on a layer of titanium nitride, the hydrogen radical treatment reduces interfacial fluorine content at the tungsten-titanium nitride interface. During the hydrogen radical treatment of tungsten, diatomic hydrogen ($H_2$) source gas is introduced to the plasma processing source to generate hydrogen radicals. The flow rate of $H_2$ is about 100 sccm to about 1200 sccm, such as about 200 sccm to about 1000 sccm, such as about 100 sccm to about 500 sccm, such as about 200 sccm, such as about 500 sccm to about 1200 sccm, such as about 1000 sccm. It is contemplated that the source gas may be mixed with an inert gas (e.g., Ar).

During hydrogen radical treatment of tungsten, the temperature in the process chamber is about 500° C. to about 1000° C., such as about 500° C. to about 600° C., such as about 600° C. to about 700° C., such as about 650° C., such as about 700° C. to about 800° C., such as about 750° C., such as about 800° C. to about 900° C., such as about 850° C., such as about 900° C. to about 1000° C., such as about 950° C. During processing, increasing temperature in the process chamber leads to a greater reduction in interfacial fluorine content, i.e., temperature and reduction in interfacial fluorine content are positively correlated, or in other words, temperature and interfacial fluorine content are inversely correlated. For example, operation of the process chamber at temperatures of about 950° C. or greater results in reduction of interfacial fluorine content by as much as 20-fold, whereas temperatures of about 650° C. or less only reduce interfacial fluorine content by about 1.4-fold. Temperatures of about 750° C. reduce interfacial fluorine content by about 2.1-fold, and temperatures of about 850° C. reduce interfacial fluorine content by about 4.8-fold.

During hydrogen radical treatment of tungsten, the pressure in the process chamber is about 0.2 Torr to about 2 Torr, such as about 0.5 Torr. The radio frequency power is about 1 kW to about 10 kW, such as about 5 kW to about 8 kW, such as about 5 kW, such as about 8 kW. The processing time is within a range of about 2 minutes to about 8 minutes, such as about 5 minutes.

Beneficially, the hydrogen radical treatment of tungsten performed using the plasma processing apparatus and method of the present disclosure reduces interfacial fluorine content in tungsten by about 20-fold or more. Increasing hydrogen radical density, which is possible using the apparatus and methods disclosed herein leads to even greater reduction of interfacial fluorine content. Moreover, the effects of increasing temperature and increasing hydrogen radical density have an additive impact on the reduction of interfacial fluorine. In contrast to conventional approaches, such as thermal $H_2$ anneal, conventional approaches do not reduce interfacial fluorine content. Using aspects described herein, the hydrogen radical treatment of tungsten leads to a 10% reduction in sheet resistance (Rs) of the tungsten layer compared to non-treated films.

In another example, the plasma processing apparatus of the present disclosure may be used for hydrogen radical treatment of titanium nitride (e.g., TiN) according to the method 800. Using apparatus and/or methods disclosed herein, treatment of titanium nitride with hydrogen radicals reduces Rs of the titanium nitride layer by about 50% or more compared to non-treated films by reducing impurities in the titanium nitride layer. During the hydrogen radical treatment of titanium nitride, $H_2$ source gas is introduced to the plasma processing source to generate hydrogen radicals. The flow rate of $H_2$ is about 200 sccm to about 1200 sccm, such as about 200 sccm to about 500 sccm, such as about 350 sccm, such as about 350 sccm to about 1000 sccm, such as about 500 sccm to about 1200 sccm, such as about 1000 sccm. In another example, the hydrogen radical treatment is a two-operation process, introducing $H_2$ source gas in a first operation, and then after the first operation, introducing $N_2$ source gas. It is contemplated that the source gas may be mixed with an inert gas (e.g., Ar). When $H_2$ source gas is mixed with Ar, the fraction of $H_2$ source gas is within a range of about 5% to about 90% by volume, such as about 50% by volume.

During hydrogen radical treatment of titanium nitride, the temperature in the process chamber is about 500° C. to about 1000° C., such as about 500° C. to about 600° C., such as about 550° C., such as about 600° C. to about 700° C., such as about 650° C., such as about 700° C. to about 800° C., such as about 750° C., such as about 800° C. to about 900° C., such as about 850° C., such as about 900° C. to about 1000° C. During processing, increasing temperature in the process chamber leads to a greater reduction in Rs of the titanium nitride layer, i.e., temperature and reduction in Rs of the titanium nitride layer are positively correlated, or in other words, temperature and Rs of the titanium nitride layer are inversely correlated. For example, operation of the process chamber at temperatures of about 550° C. result in a reduction in Rs of the titanium nitride layer between about 30% and 40%, temperatures of about 650° C. result in a reduction in Rs of the titanium nitride layer between about 40% and 50%, temperatures of about 750° C. result in a reduction in Rs of the titanium nitride layer between about 50% and 60%, and temperatures of about 850° C. result in a reduction in Rs of the titanium nitride layer between about 60% and 70%. During hydrogen radical treatment of titanium nitride, the pressure in the process chamber is about 0.2 Torr to about 3 Torr, such as about 0.5 Torr to about 3 Torr, such as about 0.5 Torr, such as about 2 Torr. The radio frequency power is about 1 kW to about 5 kW, such as about 2 kW. The processing time is within a range of about 2 minutes to about 8 minutes, such as about 5 minutes.

Beneficially, the hydrogen radical treatment of titanium nitride performed using the plasma processing apparatus and method of the present disclosure selectively reduces titanium-oxygen bonding, thereby reducing oxygen content in the titanium nitride layer, while keeping titanium-nitrogen bonding substantially constant. On the other hand, thermal only treatment fails to reduce titanium-oxygen bonding. Using aspects described herein, temperature and oxygen content are inversely correlated. Moreover, the hydrogen radical treatment decreases chlorine content similar to thermal only treatment. Moreover, the hydrogen radical treatment decreases carbon content, whereas thermal only treatment fails to decrease carbon content. Overall, the reduction in impurity content of at least one of chlorine, oxygen, or carbon through the hydrogen radical treatment leads to a decrease in Rs of the titanium nitride layer compared to thermal only treatment. Using aspects described herein, the hydrogen radical treatment reduces Rs of the titanium nitride layer by about 6% to about 11% compared to thermal only treatment. It is contemplated that the hydrogen radical treatment may be performed with or without the use of a grid (e.g., separation grid 116 shown in FIG. 1). Notably, the improvement due to hydrogen radical treatment compared to thermal only treatment is more pronounced without the use of a grid. In general, application of higher temperatures in the process chamber increases titanium nitride grain size which decreases Rs of the titanium nitride layer. In other words, temperature and grain size are each inversely correlated with Rs of the titanium nitride layer.

In another example, the plasma processing apparatus of the present disclosure may be used for hydrogen radical treatment of ruthenium (Ru) according to the method 800. In certain examples, a substrate undergoing the treatment process can include a ruthenium layer formed by chemical vapor deposition (CVD). Using apparatus and/or methods disclosed herein, treatment of ruthenium with hydrogen radicals improves gap fill and reduces Rs of the ruthenium layer compared to $H_2$ anneal without hydrogen radicals. During hydrogen radical treatment of ruthenium, $H_2$ source gas is introduced to the plasma processing source to generate hydrogen radicals. The flow rate of $H_2$ is about 100 sccm to about 2000 sccm. It is contemplated that the source gas may be mixed with an inert gas (e.g., Ar). When $H_2$ source gas is mixed with Ar, the fraction of $H_2$ source gas is within a range of about 5% to about 90% by volume, such as about 50% by volume.

During hydrogen radical treatment of ruthenium, the temperature in the process chamber is about 400° C. to about 500° C., such as about 450° C. The pressure in the process chamber is about 0.2 Torr to about 3 Torr. The radio frequency power is about 1 kW to about 10 kW. The processing time is within a range of about 0.5 minutes to about 10 minutes, such as about 1 minute to about 5 minutes, such as about 1 minute, such as about 5 minutes. During processing, increasing hydrogen radical density leads to a greater reduction in Rs of the ruthenium layer. For example, introducing 10% $H_2$ source gas at 450° C. for 1 minute reduces Rs of the ruthenium layer by about 35% to about 40% compared to non-treated films. On the other hand, introducing 50% $H_2$ source gas at 450° C. for 5 minutes, which corresponds to a lower hydrogen radical density, only reduces Rs of the ruthenium layer by about 30% compared to non-treated films.

Beneficially, treatment of ruthenium with hydrogen radicals performed using the plasma processing apparatus and method of the present disclosure improves gap fill of the ruthenium layer compared to $H_2$ anneal without hydrogen radicals. Moreover, the hydrogen radical treatment increases grain size and reduces seam size in the ruthenium layer relative to $H_2$ anneal. Using apparatus and/or methods disclosed herein, Rs of the ruthenium layer is reduced compared to $H_2$ anneal without hydrogen radicals. Moreover, hydrogen radical assisted anneal improves reflow and lowers resistivity with reduced thermal budget compared to $H_2$ anneal without hydrogen radicals.

In another example, the plasma processing apparatus of the present disclosure may be used for hydrogen radical and optional nitrogen radical treatment of tungsten carbonitride (e.g., WCN) according to the method 800. Using apparatus and/or methods disclosed herein, treatment of tungsten carbonitride with hydrogen radicals reduces carbon content without increasing nitrogen content in tungsten carbonitride films compared to non-treated films. Using aspects described herein, treatment of tungsten carbonitride with hydrogen radicals and nitrogen radicals reduces carbon content and increases nitrogen content in tungsten carbonitride films compared to non-treated films. During hydrogen radical treatment of tungsten carbonitride, $H_2$ source gas is introduced to the plasma processing source to generate hydrogen radicals. The flow rate of $H_2$ is about 100 sccm to about 2000 sccm. During nitrogen radical treatment of tungsten carbonitride, $N_2$ source gas is introduced to the plasma processing source to generate nitrogen radicals. The flow rate of $N_2$ is about 100 sccm to about 2000 sccm. It is contemplated that the source gas may be mixed with an inert gas (e.g., Ar).

During hydrogen radical and/or nitrogen radical treatment of tungsten carbonitride, the temperature in the process chamber is about 500° C. to about 1000° C., such as about 500° C. to about 600° C., such as about 550° C., such as about 600° C. to about 700° C., such as about 650° C., such as about 700° C. to about 800° C., such as about 750° C., such as about 800° C. to about 900° C., such as about 900° C. to about 1000° C. The pressure in the process chamber is about 0.2 Torr to about 3 Torr. The radio frequency power is about 1 kW to about 10 kW. During hydrogen radical treatment, the processing time is within a range of about 1 minute to about 10 minutes, such as about 1 minute to about 5 minutes, such as about 3 minutes. During optional nitrogen radical treatment following the hydrogen radical treatment, the processing time is within a range of about 10 seconds to about 2 minutes, such as about 30 seconds to about 1 minute, such as about 30 seconds, such as about 1 minute.

Beneficially, treatment of tungsten carbonitride with hydrogen radicals performed using the plasma processing apparatus and method of the present disclosure decreases carbon content in tungsten carbonitride films by about 3-fold to about 6-fold while nitrogen content stays about the same compared to non-treated films. Using apparatus and/or methods disclosed herein, further treatment of tungsten carbonitride with nitrogen radicals increases nitrogen content in tungsten carbonitride films by about 2-fold to about 3-fold compared to non-treated films. Therefore, each of the tungsten carbonitride treatments improves film quality compared to non-treated films.

In another example, the plasma processing apparatus of the present disclosure may be used for titanium nitride (e.g., TiN) seam removal according to the method 800. In certain examples, a substrate undergoing the treatment process can include a titanium nitride layer formed by ALD. It is contemplated that the source gas for seam removal may include $O_2$, $H_2$, $N_2$, or mixtures thereof. Introducing $O_2$ source gas improves seam removal relative to either $H_2$ or $N_2$ source gases alone. Using apparatus and/or methods disclosed herein, a process having three operations involving sequential treatment with oxygen radicals followed by hydrogen radicals followed by nitrogen radicals improves seam removal as well as oxygen radical treatment alone while also incorporating additional nitrogen to substantially restore the original stoichiometric ratio of titanium to nitrogen in the titanium nitride layer. Using apparatus and/or methods disclosed herein, oxygen radical treatment oxidizes the titanium nitride layer causing volume expansion and filling gaps between features, which removes the seam. After oxygen radical treatment, hydrogen radical treatment reduces oxygen content of the titanium nitride layer while retaining the structure of the titanium lattice. After hydrogen radical treatment, nitrogen radical treatment replaces oxygen vacancies in the titanium lattice with nitrogen, which restores the titanium nitride layer without the seam.

In another example, the plasma processing apparatus of the present disclosure may be used for selective oxidation of tungsten according to the method 800. Selective oxidation of tungsten involves oxidizing a silicon layer without oxidizing an adjacent tungsten layer. During selective oxidation of tungsten, $O_2$ source gas is introduced to the plasma processing source to generate oxygen radicals. To minimize tungsten oxidation, excess $H_2$ is added to the plasma to create a large quantity of hydrogen radicals. During selective oxidation of tungsten, the concentration of $H_2$ in the source gas is about 65% to about 95% of the total flow volume of $H_2$ and $O_2$. The ratio of $H_2$ to $O_2$ is operable to control the selectivity. For example, having $H_2$ concentration below about 65% limits the selectivity of the oxidation process. On the other hand, having $H_2$ concentration above about 95% reduces the oxidation of silicon. Apparatus and/or methods disclosed herein, which utilize a top-down plasma source, provide a uniform concentration of hydrogen radicals from center to edge of the substrate. This improves the selective oxidation of tungsten compared to side inject plasma sources in which the concentration of hydrogen radicals is depleted moving towards the center of the substrate. The flow rate of $H_2$ is about 400 sccm to 8000 sccm, and the flow rate of $O_2$ is about 100 sccm to about 3000 sccm. It is contemplated that the source gas may be mixed with an inert gas (e.g., Ar).

During selective oxidation of tungsten, the temperature in the process chamber is about 600° C. to about 1000° C., such as about 700° C. to about 900° C., such as about 800° C. The pressure in the process chamber is about 1 Torr to about 3 Torr. The radio frequency power is about 3 kW to about 5 kW, such as about 4 KW. The processing time for oxidation is within a range of about 1 minutes to about 4 minutes.

Beneficially, selective oxidation of tungsten performed using the plasma processing apparatus and method of the present disclosure achieves silicon oxide (e.g., $SiO_2$) growth rates of about 3 angstroms/(second) or greater while reducing oxygen content to about 40 atomic percent or less.

In another example, the plasma processing apparatus of the present disclosure may be used for oxidation of silicon according to the method 800. In certain examples, a substrate undergoing the oxidation process can include a layer of silicon which is treated with oxygen radicals to form a conformal layer of silicon oxide. In certain examples, the substrate can have a 3-dimensional NAND structure including a silicon nitride (e.g., SiN) via deposited by ALD within a layer stack having alternating oxide/nitride layers with, for example, 8 μm depth, 125 nm top critical dimension (CD), and aspect ratio of about 80:1. During processing, a mixture of $O_2$ and $H_2$ source gases are introduced to the plasma processing source to generate oxygen radicals and hydrogen radicals, respectively. The flow rate of $O_2$ is about 500 sccm to about 1000 sccm, such as about 750 sccm. The flow rate of $H_2$ is about 400 sccm to about 1000 sccm, such as about 400 sccm to about 600 sccm, such as about 500 sccm, such as about 600 sccm to about 900 sccm, such as about 750 sccm. It is contemplated that the source gas may be mixed with an inert gas (e.g., Ar). When a mixture of $O_2$ and $H_2$ source gases are mixed with Ar, the fraction of $H_2$ relative to $O_2$ is within a range of about 5% to about 50% by volume, such as about 33% to about 50% by volume.

During oxidation of silicon, the temperature in the process chamber is about 600° C. to about 1000° C., such as about 700° C. to about 900° C., such as about 800° C. The pressure in the process chamber is about 1 Torr to about 3 Torr, such as about 2 Torr. The radio frequency power is about 1 kW to about 10 kW. The processing time for oxidation is within a range of about 1 minutes to about 10 minutes.

Beneficially, oxidation of silicon performed using the plasma processing apparatus and method of the present disclosure can achieve silicon oxide (e.g., $SiO_2$) growth rates of about 5 angstroms/$\sqrt{(second)}$ or greater, such as about 5 angstroms/$\sqrt{(second)}$ to about 6 angstroms/$\sqrt{(second)}$, with silicon oxide conformality of about 95% to about 100%, such as about 99%. Using apparatus and/or methods disclosed herein, silicon oxide conformality is greater than silicon oxide conformality achieved using a conventional remote plasma oxidation (RPO) process. Using aspects described herein, silicon oxide conformality is dependent on the concentration of $H_2$ source gas. In particular, a greater fraction of $H_2$ source gas is correlated to greater silicon oxide conformality. In one example, introduction of source gas having 50% $H_2$ resulted in about 98% silicon oxide conformality, whereas introduction of source gas having 33% $H_2$ resulted in about 70% silicon oxide conformality and introduction of source gas having 5% $H_2$ resulted in only about 61% silicon oxide conformality. Using aspects described herein, silicon oxide conformality is independent of layer thickness at higher concentrations of $H_2$ in the source gas. For example, with source gas having about 5% $H_2$, silicon oxide conformality is dependent on layer thickness, whereas at higher $H_2$ fractions, such as about 50% $H_2$, silicon oxide conformality is substantially independent of layer thickness.

In another example, the plasma processing apparatus of the present disclosure may be used for oxygen radical and hydrogen radical treatment of silicon oxide (e.g., $SiO_x$) according to the method 800. In certain examples, a substrate undergoing the treatment process can include a layer of silicon oxide formed by flowable CVD (FCVD). $O_2$ source gas, $H_2$ source gas or a mixture thereof is introduced to the plasma processing source to generate oxygen radicals and/or hydrogen radicals, respectively. The flow rate of $O_2$ is about 500 sccm to about 3000 sccm. The flow rate of $H_2$ is about 25 sccm to about 200 sccm. It is contemplated that the source gas may be mixed with an inert gas (e.g., Ar).

During oxygen radical and/or hydrogen radical treatment of silicon oxide, the temperature in the process chamber is about 400° C. to about 600° C., such as about 500° C. The pressure in the process chamber is about 0.5 Torr to about 3 Torr. The radio frequency power is about 1 kW to about 10 kW. The processing time is within a range of about 1 minute to about 10 minutes, such as about 1 minute to about 5 minutes, such as about 1 minute, such as about 5 minutes.

Beneficially, oxygen radical and hydrogen radical treatment of silicon oxide performed using the plasma processing apparatus and method of the present disclosure reduces oxygen-hydrogen bonding, silicon-hydrogen bonding, and/or nitrogen-hydrogen bonding in silicon oxide films compared to non-treated films according to FTIR. In one example, extending the oxygen radical and hydrogen radical treatment processing time to 5 minutes can lower a wet etch reaction rate (WERR) compared to the same treatment using a processing time of 1 minute. Using apparatus and/or methods disclosed herein, WERR of the silicon oxide film is lower than the silicon oxide film treated with an anneal-only process.

In another example, the plasma processing apparatus of the present disclosure may be used for helium radical treatment of silicon oxide (e.g. $SiO_2$) according to the method 800. In certain examples, a substrate undergoing the treatment process can include a layer of silicon oxide (e.g., a high temperature oxide (HTO) layer), formed by ALD. It is contemplated that helium radical treatment may be used for all types of ALD films. During helium radical treatment, helium (He) source gas is introduced to the plasma processing source to generate helium radicals. The flow rate of He is about 100 sccm to about 2000 sccm. It is contemplated that the source gas may be mixed with an inert gas (e.g., Ar).

During helium radical treatment of silicon oxide, the temperature in the process chamber is about 500° C. to about 1000° C., such as about 700° C. to about 800° C., such as about 700° C., such as about 800° C. The pressure in the process chamber is about 0.2 Torr to about 4 Torr, such as about 0.5 Torr to about 2 Torr, such as about 0.5 Torr, such as about 2 Torr. The radio frequency power is about 1 kW to about 10 kW, such as about 5 kW to about 10 kW, such as about 8 kW. The processing time is within a range of about 0.25 minutes to about 5 minutes, such as about 0.5 minutes to about 3 minutes, such as about 0.5 minutes, such as about 3 minutes.

Beneficially, helium radical treatment of silicon oxide performed using the plasma processing apparatus and method of the present disclosure improves film quality of the silicon oxide layer and decreases leakage thereof compared to non-treated films. Using apparatus and/or methods disclosed herein, film quality, which refers to the portion of film being etched and resulting reduction in WERR of the treated film, improves by about 50% to about 60% compared to non-treated films. Moreover, post wet etch sidewall conformality of the silicon oxide layer is improved by a greater degree at lower pressure, namely at 0.5 Torr compared to 2 Torr.

In another example, the plasma processing apparatus of the present disclosure may be used for hydrogen radical treatment of a boron-rich amorphous carbon layer according to the method 800. In certain examples, a substrate undergoing the treatment process can include a boron-doped carbon-based hardmask layer. In one example, the boron-doped carbon-based hardmask layer is deposited by CVD, and the hydrogen plasma treatment is performed post CVD. The hardmask layer may have a thickness of about 0.2 μm. During hydrogen radical treatment, $H_2$ source gas is introduced to the plasma processing source to generate hydrogen radicals. The flow rate of $H_2$ is about 100 sccm to about 2000 sccm. It is contemplated that the source gas may be mixed with an inert gas (e.g., Ar).

During hydrogen radical treatment, the temperature in the process chamber is about 400° C. to about 1000° C., such as about 500° C. to about 700° C., such as about 500° C., such as about 700° C. The pressure in the process chamber is about 0.5 Torr to about 3 Torr. The radio frequency power is about 1 kW to about 10 kW. The processing time is within a range of about 3 minutes to about 5 minutes, such as about 4 minutes.

Beneficially, hydrogen radical treatment of boron-rich amorphous carbon films performed using the plasma processing apparatus and method of the present disclosure reduces hydrogen content of the films thereby increasing Young's modulus and density compared to non-treated films. In general, the hydrogen radical treatment yields denser films with lower overall stress which improves film stability compared to non-treated films.

In another example, the plasma processing apparatus of the present disclosure may be used for a variety of ALD pre- and post-treatments using a source gas including at least one of $H_2$, $NH_3$, $N_2$, $O_2$, or Ar according to the method 800.

In one example, the plasma processing apparatus of the present disclosure may be used for treatment of silicon nitride (e.g., SiN) films according to the method 800. During hydrogen radical treatment, $H_2$ source gas is introduced to the plasma processing source to generate hydrogen radicals. The flow rate of $H_2$ is about 500 sccm to about 1500 sccm, such as about 1000 sccm. The $H_2$ fraction in the source gas is about 50% by volume. During combined treatment with hydrogen and nitrogen radicals, $N_2$ is optionally added to the plasma processing source to generate nitrogen radicals after the treatment with hydrogen radicals. The flow rate of $N_2$ is about 200 sccm to about 400 sccm, such as about 300 sccm.

The $N_2$ fraction in the source gas is about 10% by volume. It is contemplated that other nitrogen source gases may be utilized. For example, $NH_3$ may be introduced to the plasma processing source to generate NH radicals. The flow rate of $NH_3$ is about 200 sccm to about 400 sccm, such as about 300 sccm. The $NH_3$ fraction in the source gas is about 10% by volume. It is contemplated that the source gas may mixed with an inert gas (e.g., Ar).

During the hydrogen radical, nitrogen radical, and/or NH radical treatment of silicon nitride, the temperature in the process chamber is about 800° C. to about 1200° C., such as about 900° C. to about 1000° C., such as about 950° C. The pressure in the process chamber is about 0.25 Torr to about 2 Torr, such as about 0.5 Torr to about 1 Torr, such as about 0.5 Torr, such as about 1 Torr. The radio frequency power is about 5 kW to about 10 kW, such as about 8 kW. The processing time is within a range of about 1 minute to about 10 minutes, such as about 1 minute to about 3 minutes, such as about 2.5 minutes, such as about 3 minutes to about 4 minutes, such as about 3.3 minutes, such as about 4 minutes to about 6 minutes, such as about 5 minutes.

Beneficially, treatment of silicon nitride films performed using the plasma processing apparatus and method of the present disclosure reduces impurity content of at least one of oxygen, hydrogen, or chlorine compared to non-treated films. Using apparatus and/or methods disclosed herein, the hydrogen radical, nitrogen radical, and/or NH radical treatment of silicon nitride films decreases WERR compared to WERR of silicon nitride films treated using rapid thermal processing (RTP) anneal. Using aspects described herein, the effect of the silicon nitride treatment is most pronounced at the top surface of the film (e.g., within 20 angstroms of the surface). Notably, combined treatment with hydrogen and nitrogen radicals generated using $H_2$ and $N_2$ source gases, respectively, improves removal of hydrogen from the silicon nitride film compared to treatment with either hydrogen or NH radicals generated using $H_2$ or $NH_3$ source gases, respectively, alone. Moreover, combined treatment with hydrogen and nitrogen radicals generated using $H_2$ and $N_2$ source gases, respectively, improves removal of chlorine from the silicon nitride film compared to treatment with nitrogen or NH radicals generated using either $N_2$ or $NH_3$ source gases alone.

In another example, plasma processing apparatus of the present disclosure may be used for silicon nitride (e.g., SiN) seam removal according to the method 800. In certain examples, a substrate undergoing the treatment process can include a silicon nitride layer formed by ALD. It is contemplated that the source gas may include $O_2$, $H_2$, $N_2$, or mixtures thereof. In one example, the treatment includes only one operation involving $O_2$ source gas. In another example, the treatment includes two operations involving $O_2$ source gas followed by $H_2$ source gas. In yet another example, the treatment includes three operations involving $O_2$ source gas followed by $H_2$ source gas followed by $N_2$ source gas. $O_2$ source gas is introduced to the plasma processing source to generate oxygen radicals. The flow rate of $O_2$ is about 2500 sccm to about 3500 sccm, such as about 3000 sccm. $H_2$ source gas is optionally introduced to the plasma processing source to generate hydrogen radicals after the treatment with oxygen radicals. The flow rate of $H_2$ is about 200 sccm to about 500 sccm, such as about 300 sccm to about 350 sccm, such as about 300 sccm, such as about 350 sccm. $N_2$ source gas is optionally added to the plasma processing source to generate nitrogen radicals after the treatment with oxygen radicals and hydrogen radicals. The flow rate of $N_2$ is about 200 sccm to about 400 sccm, such as about 300 sccm. It is contemplated that the source gas may be mixed with an inert gas (e.g., Ar).

During oxygen radical, hydrogen radical, and/or nitrogen radical treatment of silicon nitride, the temperature in the process chamber is about 500° C. to about 1000° C., such as about 600° C. to about 700° C., such as about 650° C., such as about 700° C. to about 800° C., such as about 750° C. The pressure in the process chamber is about 0.5 Torr to about 5 Torr, such as about 1 Torr to about 3 Torr, such as about 1 Torr, such as about 3 Torr. The radio frequency power is about 5 kW to about 10 kW, such as about 8 kW. The processing time is within a range of about 1 minute to about 10 minutes, such as about 1 minute to about 3 minutes, such as about 2.5 minutes, such as about 3 minutes to about 6 minutes, such as about 5 minutes.

Beneficially, sequential treatment using oxygen radicals followed by hydrogen radicals followed by nitrogen radicals improves seam removal as well as oxygen radical treatment alone while also incorporating additional nitrogen to substantially restore the original stoichiometric ratio of silicon to nitrogen in the silicon nitride layer. Using apparatus and/or methods disclosed herein, oxygen radical treatment oxidizes the silicon nitride causing volume expansion and filling gaps between features, which removes the seam. After oxygen radical treatment, hydrogen radical treatment reduces oxygen content of the silicon nitride layer while retaining the structure of the silicon lattice. After hydrogen radical treatment, nitrogen radical treatment replaces oxygen in the silicon lattice with nitrogen, which restores the silicon nitride layer without the seam.

In another example, the plasma processing apparatus of the present disclosure may be used for a variety of gas phase doping treatments using a source gas including at least one of $PH_3$, $BF_3$, $AsH_3$, or Ga according to the method 800.

In another example, the plasma processing apparatus of the present disclosure may be used for nitridation of high-k dielectric materials, such as hafnium oxide (e.g., $HfO_2$), according to the method 800. In certain examples, a substrate undergoing the treatment process includes a silicon substrate, an interfacial layer (e.g., comprising silicon oxide) over the silicon substrate, and a hafnium oxide layer over the interfacial layer. During high-k nitridation, source gas including a mixture of $N_2$ and $NH_3$ is introduced to the plasma processing source to generate nitrogen and NH radicals. The flow rate of $N_2$ is about 30 sccm to about 180 sccm, such as about 50 sccm to about 150 sccm, such as about 50 sccm to about 100 sccm, such as about 50 sccm, such as about 100 sccm to about 150 sccm, such as about 100 sccm, such as about 120 sccm. The flow rate of $NH_3$ is about 10 sccm to about 50 sccm, such as about 10 sccm to about 20 sccm, such as about 15 sccm. It is contemplated that the source gas may be mixed with an inert gas (e.g., Ar). The flow rate of Ar is about 2500 sccm to about 3500 sccm, such as about 3000 sccm.

During hafnium oxide nitridation, the temperature in the process chamber is less than about 400° C., such as about 150° C. to about 400° C., such as about 200° C. to about 300° C., such as about 300° C. to about 400° C., such as about 300° C., such as about 325° C. It is contemplated that the temperature may ramp during hafnium oxide nitridation. For example, the temperature may ramp from less than about 200° C. up to greater than about 300° C. The ramp time may be from about 60 seconds to about 120 seconds, such as about 90 seconds. The pressure in the process chamber is about 0.5 Torr to about 2 Torr, such as about 0.75 Torr. The radio frequency power is about 5 kW to about 10 kW, such as about 8 kW. The processing time is within a range of about 20 seconds to about 5 minutes, such as about 20 seconds to about 2 minutes, such as about 25 seconds, such as about 90 seconds, such as about 2 minutes to about 4 minutes, such as about 2.5 minutes, such as about 4 minutes. The shortened processing times associated with hafnium oxide nitridation using the apparatus and/or methods disclosed herein improve throughput compared to nitridation using a mixture of $NH_3$ and Ar gas in a conventional ICP chamber.

Beneficially, hafnium oxide nitridation with a mixture of $N_2$ and $NH_3$ substantially prevents thinning of the interfacial layer compared to nitridation using a mixture of $NH_3$ and Ar gas in a conventional ICP chamber. The addition of $N_2$ to the $NH_3$ source gas reduces the concentration of hydrogen radicals by combining with the hydrogen radicals to form NH radicals. This reduction in hydrogen radicals reduces attack by the hydrogen radicals on the interfacial layer, thereby preventing thinning of the interfacial layer. Moreover, using a mixture of $N_2$ and $NH_3$ substantially prevents thickening of the interfacial layer compared to $N_2$ alone. Adding Ar to the mixture of $N_2$ and $NH_3$ increases the nitridation rate compared to $N_2$ and $NH_3$ without Ar.

In general, using apparatus and/or methods disclosed herein with a mixture of $N_2$ and $NH_3$, reduction in temperature further inhibits thinning of the interfacial layer. For example, temperatures below about 400° C. inhibit thinning of the interfacial layer compared to higher temperatures. In general, using apparatus and/or methods disclosed herein with a mixture of $N_2$ and $NH_3$, increasing treatment time increases nitrogen content in the hafnium oxide layer. For example, treatment times within a range of about 2 minutes to about 3 minutes, increase nitrogen content from less than about 5% up to about 15% to about 20% and maintain thickness of the interfacial layer about equal to the thickness before nitridation. However, treatment times greater than about 4 minutes lead to thickening of the interfacial layer compared to relatively shorter treatment times. Therefore, it may be desirable to limit the treatment time to less than about 4 minutes. In general, using apparatus and/or methods disclosed herein with a mixture of $N_2$ and $NH_3$, reduction in pressure increases nitrogen content in the hafnium oxide layer and further inhibits thinning of the interfacial layer. For example, pressures below about 1 Torr increase nitrogen content to greater than about 10% while maintaining thickness of the interfacial layer about equal to the thickness before nitridation. Using apparatus and/or methods disclosed herein with a mixture of $N_2$ and $NH_3$ increases hafnium-nitrogen bonding and substantially prevents formation of nitrogen-oxygen metastable bonds. Using apparatus and/or methods disclosed herein, conformality and uniform pattern loading are improved due to an increased concentration of NH radicals compared to using a conventional ICP chamber.

As used herein, the terms "inner" and "outer"; "up" and "down"; "upper" and "lower"; "top" and "bottom", "vertical" and "horizontal", "upward" and "downward"; "above" and "below"; and other like terms as used herein refer to relative positions to one another and are not intended to denote a particular direction or spatial orientation of the overall source/apparatus. As used herein, the terms "approximately" or "about" refer to being within at least ±5% of the reference value.

While the foregoing is directed to embodiments of the present disclosure, other and further embodiments of the disclosure may be devised without departing from the basic scope thereof.

What is claimed is:

1. A plasma processing method comprising:
   introducing a first process gas into a region of a plasma source from an outlet of one or more peripheral channels in fluid connection with one or more peripheral injection ports of the plasma source and a second process gas into the region from a center channel in fluid connection with a center gas injection port of the plasma source, the center channel being fluidly isolated from the peripheral channels upstream of the region, wherein the center channel is disposed within a gas injection insert and fluidly coupled to a first gas distribution plenum, the first gas distribution plenum fluidly coupled to a second gas distribution plenum between a bottom edge of the gas injection insert and a distribution platform, wherein the distribution platform is configured to direct gas horizontally, and wherein the second gas distribution plenum is vertically offset from the outlet of the one or more peripheral channels, the plasma source including a dielectric sidewall surrounding the gas injection insert and the region, the plasma source surrounded by an induction coil;
   generating an inductively coupled plasma within the region with the induction coil positioned proximate the dielectric sidewall and horizontally overlapping the region, wherein the plasma includes at least one radical species selected from oxygen, nitrogen, hydrogen, NH and helium;
   delivering the plasma from the plasma source to a process chamber coupled therewith, wherein the plasma flows through a separation grid disposed between the plasma source and a substrate to be processed; and
   processing the substrate within the process chamber, wherein processing the substrate includes:
      contacting the plasma including the at least one radical species with a first side of the substrate facing the separation grid; and
      heating the substrate.

2. The method of claim 1, wherein the substrate includes a layer of tungsten carbonitride, wherein the process gas includes hydrogen gas, wherein the plasma includes hydrogen radicals, and wherein contacting the hydrogen radicals with the tungsten carbonitride layer during heating decreases carbon content in the tungsten carbonitride layer by about 3-fold to about 6-fold without reducing nitrogen content in the tungsten carbonitride layer.

3. The method of claim 2, wherein after processing the substrate with the plasma, the method further comprises:
   introducing nitrogen gas into the region of the plasma source from the one or more peripheral injection ports and the center gas injection port;
   generating a nitrogen plasma within the region, wherein the nitrogen plasma includes nitrogen radicals;
   delivering the nitrogen plasma from the plasma source to the process chamber; and
   processing the substrate with the nitrogen plasma within the process chamber, wherein processing the substrate includes:
      contacting the nitrogen plasma including the nitrogen radicals with the first side of the substrate facing the separation grid; and
      heating the substrate, wherein contacting the nitrogen radicals with the tungsten carbonitride layer during heating increases nitrogen content in the tungsten carbonitride layer by about 2-fold to about 3-fold.

4. The method of claim 1, wherein the substrate includes a layer of titanium nitride having a seam and a starting stoichiometric ratio of titanium to nitrogen, and wherein the method comprises three sequential operations including:
- a first operation wherein the process gas includes oxygen gas, wherein the plasma includes oxygen radicals, and wherein contacting the oxygen radicals with the titanium nitride layer during heating oxidizes the titanium nitride layer causing volume expansion of the titanium nitride layer;
- a second operation wherein the process gas includes hydrogen gas, wherein the plasma includes hydrogen radicals, and wherein contacting the hydrogen radicals with the titanium nitride layer during heating reduces oxygen content of the titanium nitride layer thereby removing the seam and changing the stoichiometric ratio of titanium to nitrogen; and
- a third operation wherein the process gas includes nitrogen gas, wherein the plasma includes nitrogen radicals, and wherein contacting the nitrogen radicals with the titanium nitride layer during heating increases nitrogen content of the titanium nitride layer thereby substantially restoring the starting stoichiometric ratio of titanium to nitrogen of the titanium nitride layer without the seam.

5. The method of claim 1, wherein the substrate includes a layer of tungsten, wherein the process gas includes oxygen gas, wherein the plasma includes oxygen radicals, and wherein contacting the oxygen radicals with the tungsten layer during heating increases a growth rate of silicon oxide to about 3 angstroms/√(second) or greater and reduces oxygen content of the tungsten to about 40 atomic percent or less.

6. The method of claim 1, wherein the substrate includes a layer of silicon, wherein the process gas includes oxygen gas, wherein the plasma includes oxygen radicals, and wherein contacting the oxygen radicals with the silicon layer during heating increases a growth rate of silicon oxide to about 5 angstroms/√(second) or greater with silicon oxide conformality of about 95% to about 100%.

7. The method of claim 1, wherein the substrate includes a layer of silicon oxide, wherein the process gas includes a mixture of oxygen gas and hydrogen gas, wherein the plasma includes oxygen and hydrogen radicals, and wherein contacting the oxygen and hydrogen radicals with the silicon oxide layer during heating reduces oxygen-hydrogen bonding, silicon-hydrogen bonding, and nitrogen-hydrogen bonding in the silicon oxide layer compared to the silicon oxide layer before processing.

8. The method of claim 1, wherein the substrate includes a layer of silicon oxide, wherein the process gas includes helium gas, wherein the plasma includes helium radicals, and wherein contacting the helium radicals with the silicon oxide layer during heating improves film quality of the silicon oxide layer compared to the silicon oxide layer before processing.

9. The method of claim 1, wherein processing the substrate comprises a chemical vapor deposition post-treatment.

10. The method of claim 1, wherein processing the substrate comprises an atomic layer deposition pre- or post-treatment.

11. The method of claim 1, wherein the substrate includes a layer of silicon nitride, wherein the process gas includes at least one of hydrogen gas, nitrogen gas, or ammonia, wherein the plasma includes at least one of hydrogen, nitrogen, or NH radicals, and wherein contacting the hydrogen, nitrogen, or NH radicals with the silicon nitride layer during heating reduces impurity content of oxygen, hydrogen, and chlorine in the silicon nitride layer.

12. The method of claim 1, wherein the substrate includes a layer of silicon nitride having a seam and a starting stoichiometric ratio of silicon to nitrogen, and wherein the method comprises three sequential operations including:
- a first operation wherein the process gas includes oxygen gas, wherein the plasma includes oxygen radicals, and wherein contacting the oxygen radicals with the silicon nitride layer during heating oxidizes the silicon nitride layer causing volume expansion of the silicon nitride layer thereby removing the seam and changing the stoichiometric ratio of silicon to nitrogen;
- a second operation wherein the process gas includes hydrogen gas, wherein the plasma includes hydrogen radicals, and wherein contacting the hydrogen radicals with the silicon nitride layer during heating reduces oxygen content of the silicon nitride layer; and
- a third operation wherein the process gas includes nitrogen gas, wherein the plasma includes nitrogen radicals, and wherein contacting the nitrogen radicals with the silicon nitride layer during heating increases nitrogen content of the silicon nitride layer thereby substantially restoring the starting stoichiometric ratio of silicon to nitrogen of the silicon nitride layer without the seam.

13. The method of claim 1, wherein the process gas includes at least one of $PH_3$, $BF_3$, $AsH_3$, or Ga, and wherein processing the substrate comprises gas phase doping.

14. A plasma processing method comprising:
- introducing a first process gas into a region of a plasma source from an outlet of one or more peripheral channels in fluid connection with one or more peripheral injection ports of the plasma source and a second process gas into the region from a center channel in fluid connection with a center gas injection port of the plasma source, the center channel being fluidly isolated from the peripheral channels upstream of the region, wherein the center channel is disposed within a gas injection insert and fluidly coupled to a first gas distribution plenum, the first gas distribution plenum fluidly coupled to a second gas distribution plenum between a bottom edge of the gas injection insert and a distribution platform, wherein the distribution platform is configured to direct gas horizontally, and wherein the second gas distribution plenum is vertically offset from the outlet of the one or more peripheral channels, the plasma source including a dielectric sidewall surrounding the gas injection insert and the region, and wherein the plasma source is surrounded by an induction coil;
- generating a plasma within the region with the induction coil positioned proximate the sidewall and horizontally overlapping the region, the induction coil having a top turn above a bottom edge of the gas injection insert and a bottom turn below the bottom edge of the gas injection insert, wherein the plasma includes at least one of nitrogen or NH radicals;
- delivering the plasma from the plasma source to a process chamber coupled therewith, wherein the plasma flows through a separation grid disposed between the plasma source and a substrate to be processed; and
- processing the substrate within the process chamber, wherein processing the substrate includes:
  - contacting the plasma with a first side of the substrate facing the separation grid; and
  - heating the substrate.

15. The method of claim 14, wherein the substrate includes a layer of silicon oxide, wherein the process gas includes at least one of nitrogen gas, ammonia, or a mixture thereof, and wherein contacting the nitrogen or NH radicals with the layer of silicon oxide during heating increases nitrogen content of the silicon oxide layer at approximately the same level of nitrogen conformality.

16. The method of claim 14, wherein the substrate includes a layer of silicon, wherein the process gas includes nitrogen gas, and wherein contacting the nitrogen radicals with the layer silicon during heating forms a conformal layer of silicon nitride.

17. The method of claim 14, wherein the substrate includes a layer of tungsten, wherein the process gas includes nitrogen gas, and wherein contacting the nitrogen radicals with the layer of tungsten during heating forms a conformal layer of tungsten nitride.

18. The method of claim 14, wherein the substrate includes a layer of high-k dielectric disposed over an interfacial layer, wherein the process gas includes nitrogen gas, ammonia and argon, and wherein contacting the NH radicals with the layer of high-k dielectric during heating increases nitrogen content of the high-k dielectric layer without substantial thinning of the interfacial layer.

19. A plasma processing method comprising:
introducing a first process gas into a region of a plasma source from an outlet of one or more peripheral channels in fluid connection with one or more peripheral injection ports of the plasma source and a second process gas into the region from a center channel in fluid connection with a center gas injection port, the center channel being fluidly isolated form the peripheral channels upstream of the region, wherein the center channel is disposed within a gas injection inset and fluidly coupled to a first gas distribution plenum, the first gas distribution plenum fluidly coupled to a second gas distribution plenum between a bottom edge of the gas injection insert and a distribution platform, wherein the distribution platform is configured to direct gas horizontally, and wherein the second gas distribution plenum is vertically offset from the outlet of the one or more peripheral channels, wherein the region is defined between the gas injection insert and a sidewall of a plasma source;
generating a hydrogen plasma within the region with an induction coil positioned proximate the sidewall and horizontally overlapping the region, the induction coil having a top turn above a bottom edge of the gas injection insert and a bottom turn below the bottom edge of the gas injection insert, wherein the hydrogen plasma includes hydrogen radicals;
delivering the hydrogen plasma from the plasma source to a process chamber coupled therewith, wherein the hydrogen plasma flows through a separation grid disposed between the plasma source and a substrate to be processed; and
processing the substrate within the process chamber, wherein processing the substrate includes:
contacting the hydrogen plasma including the hydrogen radicals with a first side of the substrate facing the separation grid; and
heating the substrate.

20. The method of claim 19, wherein the substrate includes a layer of tungsten, wherein the process gas includes hydrogen gas, and wherein contacting the hydrogen radicals with the layer of tungsten during heating reduces interfacial fluorine content of the tungsten layer by about 2-fold to about 20-fold.

21. The method of claim 19, wherein the substrate includes a layer of titanium nitride, wherein the process gas includes hydrogen gas, and wherein contacting the hydrogen radicals with the titanium nitride layer during heating reduces impurity content of oxygen, chlorine, and carbon in the titanium nitride layer greater than thermal only treatment.

22. The method of claim 19, wherein the substrate includes a layer of ruthenium, wherein the process gas includes hydrogen gas, and wherein contacting the hydrogen radicals with the ruthenium layer during heating improves ruthenium gap fill relative to hydrogen anneal without hydrogen radicals.

23. The method of claim 19, wherein the substrate includes a layer of boron-doped carbon, wherein the process gas includes hydrogen gas, and wherein contacting the hydrogen radicals with the boron-doped carbon layer during heating reduces hydrogen content of the boron-doped carbon layer thereby increasing Young's modulus and density of the boron-doped carbon layer.

* * * * *